US006661715B2

(12) United States Patent
Ishikawa et al.

(10) Patent No.: US 6,661,715 B2
(45) Date of Patent: **\*Dec. 9, 2003**

(54) MICROCOMPUTER AND MICROPROCESSOR HAVING FLASH MEMORY OPERABLE FROM SINGLE EXTERNAL POWER SUPPLY

(76) Inventors: Eiichi Ishikawa, 1201 Lawrence Apts., West Dr., Princeton, NJ (US) 08540; Yasuyuki Saito, 489-1-103, Naka-machi, Kodaira-shi, Tokyo (JP); Masanao Sato, 2-11-14-103, Matsubara, Setagaya-ku, Tokyo (JP); Naoki Yada, 259-1-2-1-102, Kamihirose, Sayama-shi, Saitama (JP); Kiyoshi Matsubara, 2-3-11-210, Misumi-cho, Higashimurayama-shi, Tokyo (JP)

(\*) Notice: Subject to any disclaimer, the term of this patent is extended or adjusted under 35 U.S.C. 154(b) by 0 days.

This patent is subject to a terminal disclaimer.

(21) Appl. No.: 10/160,074

(22) Filed: Jun. 4, 2002

(65) Prior Publication Data

US 2002/0149988 A1 Oct. 17, 2002

Related U.S. Application Data

(63) Continuation of application No. 09/874,116, filed on Jun. 6, 2001, now Pat. No. 6,407,959, which is a continuation of application No. 09/694,487, filed on Oct. 24, 2000, now Pat. No. 6,327,212, which is a continuation of application No. 09/397,851, filed on Sep. 17, 1999, now Pat. No. 6,154,412, which is a continuation of application No. 09/016,300, filed on Jan. 30, 1998, now Pat. No. 5,991,221.

(30) Foreign Application Priority Data

Jan. 31, 1997 (JP) ................................. 9-18413

(51) Int. Cl.[7] .............................................. G11C 16/04
(52) U.S. Cl. ........................... 365/189.12; 365/189.09; 365/189.11

(58) Field of Search ................... 365/189.06, 189.09, 365/189.11, 189.12, 189.01, 240, 185.33, 185.28, 185.29

(56) References Cited

U.S. PATENT DOCUMENTS

| 4,229,667 A | | 10/1980 | Heimbigner et al. |
| 4,962,484 A | | 10/1990 | Takeshima |
| 5,444,664 A | | 8/1995 | Kuroda et al. |
| 5,461,584 A | * | 10/1995 | Ikuta et al. .................. 327/509 |
| 5,537,073 A | | 7/1996 | Airomoto |
| 5,561,627 A | | 10/1996 | Matsubara et al. |
| 5,644,539 A | | 7/1997 | Yamagami et al. |
| 5,694,611 A | * | 12/1997 | Matsubara ............. 365/185.04 |
| 5,991,221 A | | 11/1999 | Ishikawa et al. |
| 6,154,412 A | | 11/2000 | Ishikawa et al. |
| 6,407,959 B2 | * | 6/2002 | Ishikawa et al. ....... 365/189.06 |

FOREIGN PATENT DOCUMENTS

| JP | 2-307259 | 12/1990 |
| JP | 8-18408 | 1/1996 |

\* cited by examiner

Primary Examiner—David Lam

(57) ABSTRACT

A microcomputer incorporating a flash memory which is erased and programmed electrically in a stable manner within a relatively wide range of external power supply voltages including those for low-voltage operations. The microcomputer comprises a voltage clamp unit including a reference voltage generating circuit and a constant voltage generating circuit. In operation, the voltage clamp unit generates a voltage of a low dependency on a supply voltage and clamps the generated voltage to a voltage level which, within a tolerable range, is lower than a single supply voltage externally furnished. This prevents voltages boosted by boosting circuits operating on the clamped voltage, i.e., programming and erasure voltages, from being dependent on the externally supplied voltage.

10 Claims, 29 Drawing Sheets

FIG. 9

| SYMBOL | NAME | REMARK |
|---|---|---|
| ○ | VCC | Vcc SUPPLY |
| — | GND | GND SUPPLY |
| ● | VPPX1 | POSITIVE VOLTAGE SUPPLY 1 ON WORD DRIVERS |
| ⊙ | VPPX2 | POSITIVE VOLTAGE SUPPLY 2 ON WORD DRIVERS |
| ▶ | VSSXS | NEGATIVE VOLTAGE SUPPLY FOR SOURCE ON WORD DRIVERS |
| ▽ | VSSXW | NEGATIVE VOLTAGE SUPPLY FOR WELL ON WORD DRIVERS |
| ○ | VPPY | Y-SW & Z-SW SUPPLY |
| ① | VCC1 | LEVEL-SHIFTER SUPPLY |
| ⊗ | VCCSA | SENSE AMPLIFIER SUPPLY |
| ▦ | VPPW | PROGRAMMING CIRCUIT SUPPLY |
| ▽ | VSSE | NEGATIVE VOLTAGE SUPPLY FOR CONTROLLING Z-SW, SUBSTRATE AND SOURCE |

FIG. 10

| STATE | X-DEC | | | | | Y-DEC & Z-DEC | | LEVEL-SHIFT | SENSE AMPLIFIER | PROGRAMMING CIRCUIT | | Z-SW & SOURCE & SUBSTRATE |
|---|---|---|---|---|---|---|---|---|---|---|---|---|
| | HIGH | | | LOW | | HIGH | | | | HIGH | | LOW |
| | VPPX1 | VPPX2 | VSSXS | VSSXW | | VPPY | | VCC1 | VCCSA | VPPW | | VSSE |
| PROGRAMMING | GND | VfixA (Vsft) | -9.5V (*2) | -9.5V (*2) | | 9.5V (*1) | | VfixA (Vsft) | VfixA (Vsft) | 6.5V (*1) | | GND |
| PROGRAMMING SETUP | Vsft⇔GND | VfixA (Vsft) | GND⇔-9.5V (BOOSTING) | GND⇔-9.5V (BOOSTING) | | Vcc⇔9.5V (BOOSTING) | | VfixA (Vsft) | VfixA (Vsft) | Vcc⇔6.5V (BOOSTING) | | GND |
| ERASURE | 9.5V (*1) | 9.5V (*1) | GND | GND | | VfixA (Vsft) | | VfixA (Vsft) | VfixA (Vsft) | Vcc | | -9.5V (*2) |
| ERASURE SETUP | Vcc | Vcc | GND | GND | | VfixA (Vsft) | | VfixA (Vsft) | VfixA (Vsft) | Vcc | | -9.5V (*2) |
| PROGRAMMING VERIFY | VfixA (Vsft) | VfixA (Vsft) | GND | GND | | VfixA (Vsft) | | VfixA (Vsft) | VfixA (Vsft) | Vcc | | GND |
| ERASE VERIFY | 6.5V (*1) | 6.5V (*1) | GND | GND | | VfixA (Vsft) | | VfixA (Vsft) | VfixA (Vsft) | Vcc | | GND |
| READ | VfixA (Vread) | VfixA (Vread) | GND | GND | | Vcc | | VfixA (Vread) | Vcc | Vcc | | GND |
| READ | VfixA (Vread) | VfixA (Vread) | GND | GND | | Vcc | | VfixA (Vread) | Vcc | Vcc | | GND |

*1 : POSITIVE BOOSTING
*2 : NEGATIVE BOOSTING

FIG. 11

| | VPPX1 | VPPX2 | VSSXS | VSSXW | VPPY | VCC1 | VCCSA | VPPW | VSSE |
|---|---|---|---|---|---|---|---|---|---|
| 9.5V (*1) | ● | ● | | | ● | | | | |
| 6.5V (*1) | ● | ● | | | ● | | | ● | |
| Vcc | ● | ● | | | ● | ● | ● | ● | |
| VfixA | ● | ● | | | ● | ● | ● | | |
| GND | ● | | ● | ● | | | | | ● |
| −9.5V (*2) | | | ● | ● | | | | | ● |

*1 : POSITIVE BOOSTING  
*2 : NEGATIVE BOOSTING

POSITIVE VOLTAGE MONITOR

REFERENCE VOLTAGE TRIMMING

FIG. 25

| REGISTER SPECIFICATION | A2 | A2 | A2 | bit7 | bit6 | bit5 | bit4 | bit3 | bit2 | bit1 | bit0 |
|---|---|---|---|---|---|---|---|---|---|---|---|
| FLMCR1 | 0 | 0 | 0 | FWE | SWE | ESU | PSU | EV | PV | E | P |
| EBR1 | 0 | 1 | 0 | EB7 | EB6 | EB5 | EB4 | EB3 | EB2 | EB1 | EB0 |
| TRMR1 | 1 | 1 | 0 | TEVR | VR4 | VR3 | VR2 | VR1 | BR0 | — | — |
| TRMR2 | 1 | 1 | 1 | TEVM | VM4 | VM3 | VM2 | VM1 | VM0 | — | — |

NEW PROVIDED BITS FOR PROGRAMMING/ERASURE (PSU, ESU)

FOR TRIMMING

FIG. 30

(*) ERASE STATE OF THE MEMORY CELL IS "1"
PROGRAMMING IS EXECUTED TO THE MEMORY CELL WHOSE STATE
IS TO BE DATA "0"

| ORIGINAL PROGRAMMING DATA (D) | VERIFY DATA (V) | RE-PROGRAMMING DATA (X) | COMMENT |
|---|---|---|---|
| 0 | 0 | 1 | NO RE-PROGRAMMING IS EXECUTED TO THE MEMORY BIT THAT THE PROGRAMMING HAS BEEN COMPLETED |
| 0 | 1 | 0 | THE PROGRAMMING IS NOT COMPLETED, RE-PROGRAMMING IS EXECUTED |
| 1 | 0 | 1 | |
| 1 | 1 | 1 | ERASE STATE, NO PROGRAMMING IS EXECUTED |

MICROCOMPUTER AND MICROPROCESSOR HAVING FLASH MEMORY OPERABLE FROM SINGLE EXTERNAL POWER SUPPLY

This is a continuation of application Ser. No. 09/874,116, filed Jun. 6, 2001 now U.S. Pat. No. 6,407,959; which is a continuation of Ser. No. 09/694,487, filed Oct. 24, 2000, now U.S. Pat. No. 6,327,212 which is a continuation of Ser. No. 09/397,851, filed Sep. 17, 1999 (now U.S. Pat. No. 6,154,412); which is a continuation of Ser. No. 09/016,300, filed Jan. 30, 1998 (now U.S. Pat. No. 5,991,221), the entire disclosures of which are hereby incorporated by reference.

BACKGROUND OF THE INVENTION

The present invention relates to a semiconductor integrated circuit device comprising a non-volatile memory and a central processing unit. More particularly, the invention relates to techniques for providing a single-chip microcomputer, a data processing device, or a microprocessor which includes a flash memory and a central processing unit having a single external power supply.

Microcomputers incorporating a flash memory are known by the designations H8/538F, H8/3048 and H8/3434F, available from Hitachi, Ltd.

Memory cell transistors constituting a flash memory each have a floating gate, a control gate, a source and a drain. As such, each memory cell transistor retains binary information representing a charge injection state of its floating gate. For example, electrically charging the floating gate of a memory cell transistor brings a threshold voltage of that memory cell into a high state. When the threshold voltage is raised relative to the control gate, the memory cell prevents a current from flowing. Electrically discharging the floating gate of the memory cell lowers the threshold voltage with respect to the control gate, which allows the current to flow through the memory cell. Illustratively, bringing the threshold voltage of the memory cell higher than a word line selecting voltage level of a read state is called an erasure operation (providing a logical "1" which signifies an erasure state); while, bringing the threshold voltage of the memory cell lower than the word line selecting voltage level of the read state is called a programming operation (providing a logical "0" which signifies a programming state). Alternatively, the erasure state and the programming state may be defined inversely in terms of threshold voltage.

Writing or erasing data to or from memory cell transistors presupposes that their floating gates are placed in a high electric field as needed. This requires that the voltage for erasure or programming purposes be higher than the common power supply voltage, such as 3 V or 5 V. Such a high voltage is provided as an external power supply.

SUMMARY OF THE INVENTION

To obtain a high voltage externally requires that a high voltage generating circuit be mounted on the printed circuit board on which the microcomputer is assembled. To handle high voltages involves use of a specialized printed circuit board design that typically detracts from general usability.

The inventors of this invention investigated whether it was possible to use a single power supply, such as 3 V or 5 V, from which to operate a microcomputer incorporating a flash memory. The inventors' experiments involved generating a high voltage for erasure and programming by internally boosting the voltage from a single external power supply.

Some manufacturers of microcomputers, conscious of today's demand for lower power dissipation, have their devices operate on 3 V; while manufactureres of some systems design their products to operate from a single 5 V power supply. Whether to use a 3V or a 5 V power supply is determined according to the specifications of the system to which the microcomputer in question is applied. In this respect, it is in a semiconductor manufacturers' interest to design microcomputers which are capable of operating with a relatively wide range of available power supplies, such as from 3 V to 5V.

With the above points taken into consideration, the inventors proceeded with their studies and brought to light some problems of the related art. There are two major charge injection methods for charging flash memories: a channel injection method and a tunnel current method. The channel injection method involves letting a relatively large current flow through the channel of a given memory cell transistor to generate hot electrons near the drain, whereby the floating gate is electrically charged. The tunnel current method involves allowing a tunneling current to flow through a relatively thin tunnel oxide (insulating) film near the drain by application of an electric field of a predetermined intensity between the floating gate and the drain, whereby electric charging is accomplished. The inventors have found that the channel that the channel injection method was not suitable for internal voltage boosting because of its need for a relatively large current. With the tunnel current method, on the other hand, simply effecting internal voltage boosting was found insufficient to implement programming and erasure of an internal flash memory in a stable manner within a relatively wide range of external power supply voltages, including those for low-voltage operations.

It is therefore an object of the present invention to provide a semiconductor integrated circuit device such as a microcomputer,including a non-volatile memory, such as a flash memory, which can be erased and programmed electrically in a stable manner within a relatively wide range of external power supply voltages, including those for low-voltage operations.

It is another object of the present invention to provide a semiconductor integrated circuit device such as a microcomputer,which incorporates a non-volatile memory, such as a flash memory, which is capable of being erased and programmed electrically and which offers higher usability than previously available.

Other objects, features and advantages of the present invention will become apparent from the description provided in the following specification with reference to the accompanying drawings.

In carrying out the invention and according to one aspect thereof, there is provided a semiconductor integrated circuit device, such as a microcomputer, comprising a semiconductor substrate incorporating a non-volatile memory, such as a flash memory, which is capable of being erased and programmed electrically, and a central processing unit which is capable of accessing the non-volatile memory. The semiconductor integrated circuit device operates on a single power supply voltage supplied to an external power supply terminal of the semiconductor substrate. The non-volatile memory includes: voltage clamp means which, using a reference voltage with a low dependency on a power supply voltage, clamps an output voltage to a first voltage lower in level than the single power supply voltage; boosting means for boosting the voltage output by the voltage clamp means to a positive and a negative high voltage; and a plurality of non-volatile memory cells which can be erased and programmed by use of the positive and negative high voltages output by the boosting means.

In the semiconductor integrated circuit device of the above constitution, the voltage clamp means generates a voltage that is negligibly dependent on a supply voltage. The voltage thus generated is clamped to a voltage level which, within a tolerable range of supply voltages for the semiconductor integrated circuit device, is lower than the single supply voltage externally furnished. The clamping prevents the voltages boosted by the boosting means operating on the clamped voltage, i.e., programming and erasure voltages, from being dependent on the externally supplied voltage. This in turn makes it possible to erase and program the incorporated non volatile memory in a relatively wide range of externally supplied voltages, including those for low-voltage operations. Because these features are provided by use of a single external supply voltage, the semiconductor integrated circuit device incorporating the non-voltage memory is made easier and more convenient to use than before.

The efficiency of boosting may be enhanced by changing a substrate bias voltage common to MOS transistors (metal-oxide semiconductors; MIS or metal-insulating semiconductors may be used alternatively) carrying out charge pump operations when the boosted voltage has reached a predetermined level. Illustratively, the boosting means may include: a charge pump circuit having boosting nodes for negative high voltage generation, the boosting nodes being connected to p-channel MOS transistors and capacitors so as to implement a charge pump action for generating the negative high voltage; and switching means for switching halfway through a boosting operation the substrate bias voltage common to the MOS transistors from the output voltage of the voltage clamp means to a second voltage lower in level than the output voltage. The second voltage is higher in level than the boosted voltage in effect at a time of switching the voltages. In this example, a decline in the substrate bias voltage lowers the threshold voltage of the MOS transistors through what is known as the substrate bias effect. The lowered threshold voltage promotes the movement of electric charges through the MOS transistors executing charge pump operations. This in turn improves the efficiency of boosting operations and shortens the time it takes to reach a required boosted voltage.

The voltage being boosted by a charge pump operation fluctuates in amplitude in synchronism with the switching actions of the MOS transistors for charge pump operations. The resulting ripple effect may cause the substrate bias voltage to oscillate. Such oscillation is forestalled illustratively by the switching means possessing a hysteresis characteristic for maintaining the substrate bias voltage to the second voltage when the boosted voltage fluctuates in amplitude after the switching of the voltages. This kind of hysteresis characteristic may be acquired by use of a hysteresis comparator or an SR flip-flop circuit.

Where a plurality of charge pump circuits operate from a single power supply, instantaneous drops in the power supply voltage are minimized preferably by staggering the charge pump circuits in their operative phases. Illustratively, the boosting means may include: a negative volt-age boosting charge pump circuit having boosting nodes for negative high voltage generation, the boosting nodes being connected to MOS transistors and capacitors so as to implement a charge pump action for generating a negative high voltage, and a positive voltage boosting charge pump circuit having boosting nodes for positive high voltage generation, the boosting nodes being connected to MOS transistors and capacitors so as to implement a charge pump action for generating a positive high voltage In this setup, the MOS transistors in the positive voltage boosting charge pump may be arranged so as to differ in on-state phase from the MOS transistors in the negative voltage boosting charge pump.

Relatively large currents are needed to erase and program a non-volatile memory. For this reason, the power supply for a boosting circuit should not be connected directly to the power supplies for other circuits. In this respect, the voltage clamp means may preferably include: a reference voltage generating circuit for generating a reference voltage with a low dependency on a power supply voltage; a first constant voltage generating circuit for generating a voltage by placing an output circuit under control for negative feedback to the first voltage with respect to a reference voltage constituted by the reference voltage generated by the reference voltage generating circuit; and a second constant voltage generating circuit for generating a voltage by placing the output circuit under control for negative feedback to the first voltage with respect to a reference voltage constituted by the voltage output by the first constant voltage generating circuit. The voltage output by the second constant voltage generating circuit may be supplied to the positive and negative voltage boosting means.

The inventive semiconductor integrated circuit device may further comprise a third constant voltage generating circuit for generating a voltage by placing an output circuit under control for negative feedback with respect to a reference voltage constituted by the voltage output by the first constant voltage generating circuit. In this setup, the voltage output by the third constant voltage generating circuit may serve as a power supply voltage for use by a read system.

Variations in the voltage output by the voltage clamp means can result from differences between processes. To fine-adjust such output voltage variations, the voltage clamp means may preferably include: a trimming circuit; trimming control means for fine-adjusting the trimming circuit in accordance with trimming adjustment information; and register means set with the trimming adjustment information to be supplied to the trimming control means. The register means may receive the trimming adjustment information that is transferred from a specific region of the non-volatile memory. This arrangement allows the output voltage to be trimmed as desired by software. The arrangement steers clear of limitations on conventional setups which, once programmed, cannot be modified subsequently because of their use of fuses.

Where the trimming adjustment information is known to affect the read voltage for the non-volatile memory, the transfer of the trimming adjustment information from the non-volatile memory to the register means should preferably be carried out when a read operation on the memory is allowed to take longer than the predetermined time. This arrangement is desirable with a view toward preventing malfunctions. Specifically, the information transfer may be performed in synchronism with reset operations of the semiconductor integrated circuit device. This permits internal voltage fluctuations to settle within a reset operation before a trimming action is settled. After the reset, a read operation is carried out in a stable manner. Where the trimming adjustment information affects only the voltages for programming and erasure of the non-volatile memory, the transfer of the information may be carried out before a first vector fetch (instruction fetch) during the reset period or following the release of the reset state.

In view of the selection of trimming information the test mode, the central processing unit should preferably be capable of accessing the register means mentioned above.

Where the semiconductor integrated circuit device is programmed upon completion of a wafer (eg., logical "0" of a low threshold voltage) and is erased upon shipment (e.g., logical "1" of a high threshold voltage), it is desirable to minimize variations that may occur in the output voltage of the voltage clamp means as a result of the voltages being extremely trimmed between thee programming and the erasure states. The minimizing of such output voltage variations may be effected illustratively by the trimming control means including selective logic for determining trimming positions of the trimming circuit in accordance with the trimming adjustment information in such a manner that the trimming position in effect when the trimming adjustment information has an all-bit logic value of "1" is adjacent to the trimming position in effect when the trimming adjustment information has an all-bit logic value of "0." In this setup, the voltage output by the voltage clamp means may be minimized in terms of difference between where the non-volatile memory is programmed upon completion of a wafer, and where the non-volatile memory is erased upon shipment.

It takes some time for the boosting means to gain a required boosted voltage. The required time is known to suffer from process-dependent variations. A programming and an erasure operation must each be started after the boosted voltage has reached a predetermined voltage level. These aspects are controlled by the central processing unit running suitable software. Illustratively, the inventive semiconductor integrated circuit device may comprise a control register for controlling the non-volatile memory, the control register including: a programming set-up bit for instructing the boosting means to start a boosting operation for programming; a programming enable bit for designating a start of a programming operation by use of the boosted voltage; an erasing set-up bit for instructing the boosting means to start a boosting operation for erasure; and an erasing enable bit for designating a start of an erasing operation by use of the boosted voltage. This arrangement eliminates the need for additionally providing hardware, such as a timer, for controlling when to start the actual erasing or programming the device after the erasure or the programming has been designated.

Furthermore, the control register may include a programming of enable bit for instructing the boosting means to prepare for a boosting operation, so that the instruction based on any of the erasing set-up bit and the programming set-up bit is accepted only if the programming enable bit is set to its true value. That is, a programming or erasure operation is carried out on condition that the programming enable bit be set to the true value. This arrangement helps prevent the non-volatile memory from getting inadvertently reprogrammed, for example, by a runaway central processing unit.

Inadvertent reprogramming of the non-volatile memory is prevented more reliably by the control register including a protect bit, for example, which is set in accordance with an external terminal status, so that the setting of the programming enable bit to the true value is enabled in an interlocking manner only if the protect bit is set to its true value.

In order to minimize loads exerted by the negative voltage for erasure or programming upon the internal circuits, it is desirable to connect the word lines and other related parts to a ground potential before applied voltages are changed. The object is achieved illustratively by a microcomputer comprising a semiconductor substrate incorporating a flash memory capable of being erased and programmed electrically and a central processing unit capable of accessing the flash memory, the microcomputer operating on a single power supply voltage supplied to an external power supply terminal of the semiconductor substrate. The flash memory may include: a memory cell array made of a plurality of memory cell transistors each having a control gate connected to a word line, a drain connected to a bit line, and a source line connected to a source line; a boosting circuit for generating a high voltage for programming and erasure on the memory cell transistors, an address decoder for generating a word line selection signal based on an address signal; a word driver circuit for establishing a word line selection level in effect upon a read operation as a first polarity with respect to the ground potential, the word driver circuit further establishing a word line selection level in effect upon a write operation as a second polarity with respect to the ground potential, and timing control means acting upon a start and an end of a write operation to force all word lines to the ground potential, to invert logically the polarity of the selection level for the word line selection signal for the address decoder, and to switch operating power supplies of the word driver.

These and other objects, features and advantages of the invention will become more apparent upon a reading of the following description and appended drawings.

BRIEF DESCRIPTION OF THE DRAWINGS

FIG. 9 is a table listing the symbols, names and descriptions of the operation voltage supplies shown in FIG. 8;

FIG. 10 is a table showing how the voltage supplies in FIG. 8 and their operations are related;

FIG. 11 is a table summarizing voltage levels that may be taken by the operation voltage supplies in FIG. 8;

FIG. 25 is a table showing typical control register formats;

FIG. 30 is a table tabulating data operation techniques for reprogramming data.

DESCRIPTION OF THE PREFERRED EMBODIMENTS

Microcomputer Chip

Figure 3:
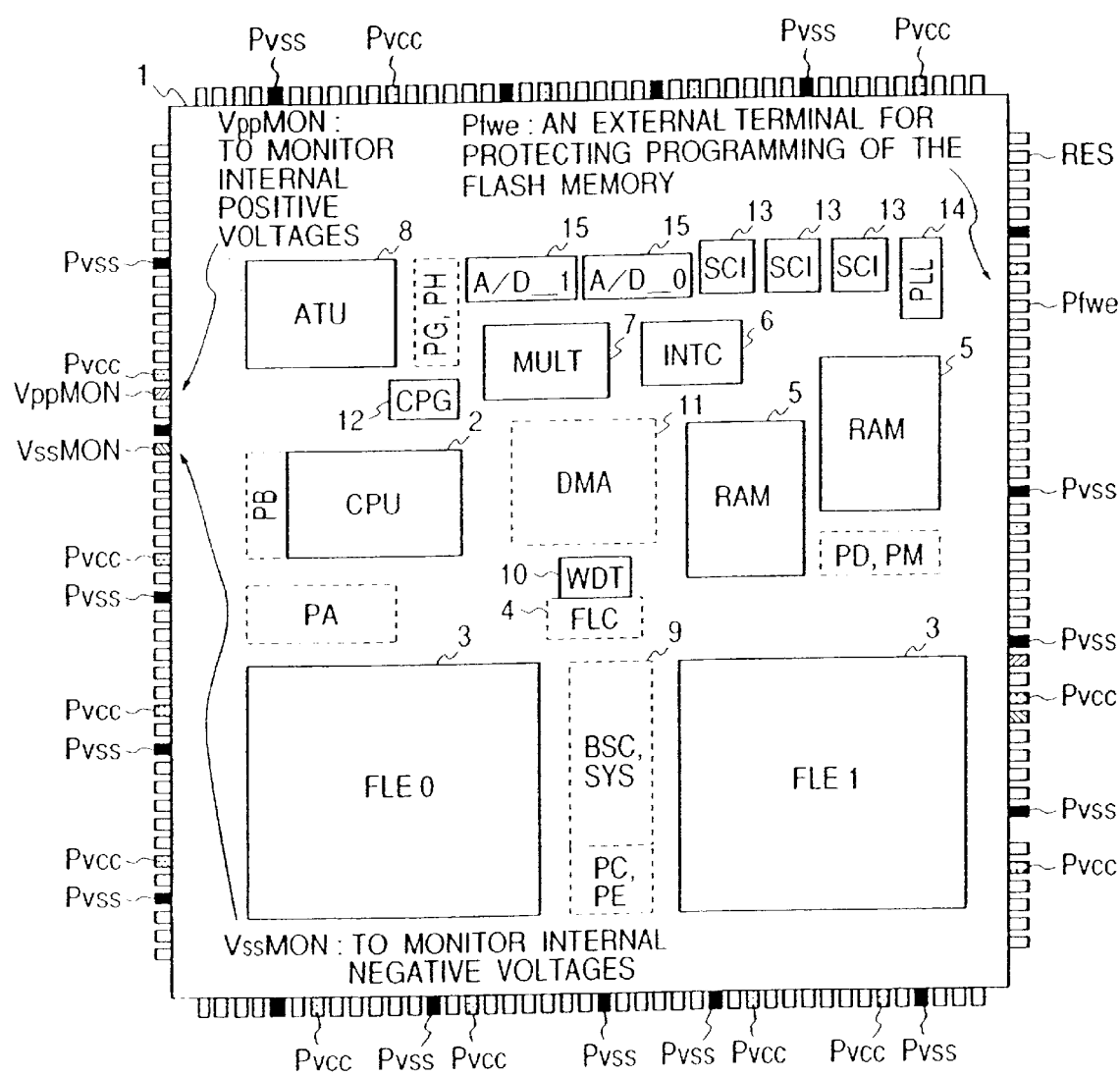
FIG. 3 is a block diagram of a microcomputer according to the invention.

FIG. 3 is a block diagram of a microcomputer 1 (microprocessor or data processor) according to the invention The microcomputer 1 is formed by use of well-known semiconductor integrated circuit fabrication techniques illustratively on a single semiconductor substrate made of materials such as single crystal silicon.

The microcomputer 1 in FIG. 3 comprises, but the invention is not limited to, a central processing unit (CPU) 2, flash memories (FLE0, FLE1) 3, a flash memory control register (FLC) 4, random access memories (RAM) 5, an interrupt controller (INTC) 6, a multiplier (MULT) 7, a timer (ATU) 8, a bus and a system controller (BSC, SYS) 9, a watch dog timer (WDT) 10, a direct memory access controller (DMA) 11, a clock pulse generator (CPG) 12, serial communication interfaces (SCI) 13, a phase locked loop circuit (PLL) 14, analog-to-digital converters (A/D_0, A/D_1), and a plurality of I/O ports PA, PB, PC, PD, PE, PG, PH and PM. The circuit blocks are connected to an address bus, a data bus and a control bus, not shown.

The microcomputer 1 is used illustratively to control the device in which it is incorporated. The operating program of the CPU 2 is stored in a flash memory 3. The RAM 5 offers a work region for the CPU 2 or a temporary storage region for data The microcomputer 1 in FIG. 3 operates from a single operating power source constituted by an external power supply voltage Vcc fed to an external power supply terminal Pvcc. A ground terminal Pvss is supplied with a ground voltage Vss. The external power supply voltage Vcc corresponds, but the invention is not so limited, to what is known as a 3V and 5V power source with ±10% tolerance. That is, the external power supply voltage Vcc is allowed to range from 2.7V to 5.5V.

In FIG. 3, reference characters RES identify a reset terminal of the microcomputer (carrying a reset signal); VppMON and VssMON denote monitor terminals to monitor internally boosted voltages; and Pfwe for a protect terminal for protection against inadvertent programming of the flash memories 3. More specifically, the terminal VppMON is provided for monitoring an internally boosted positive voltage and the terminal VssMON for monitoring an internally boosted negative voltage.

Flash Memory

Figure 4:
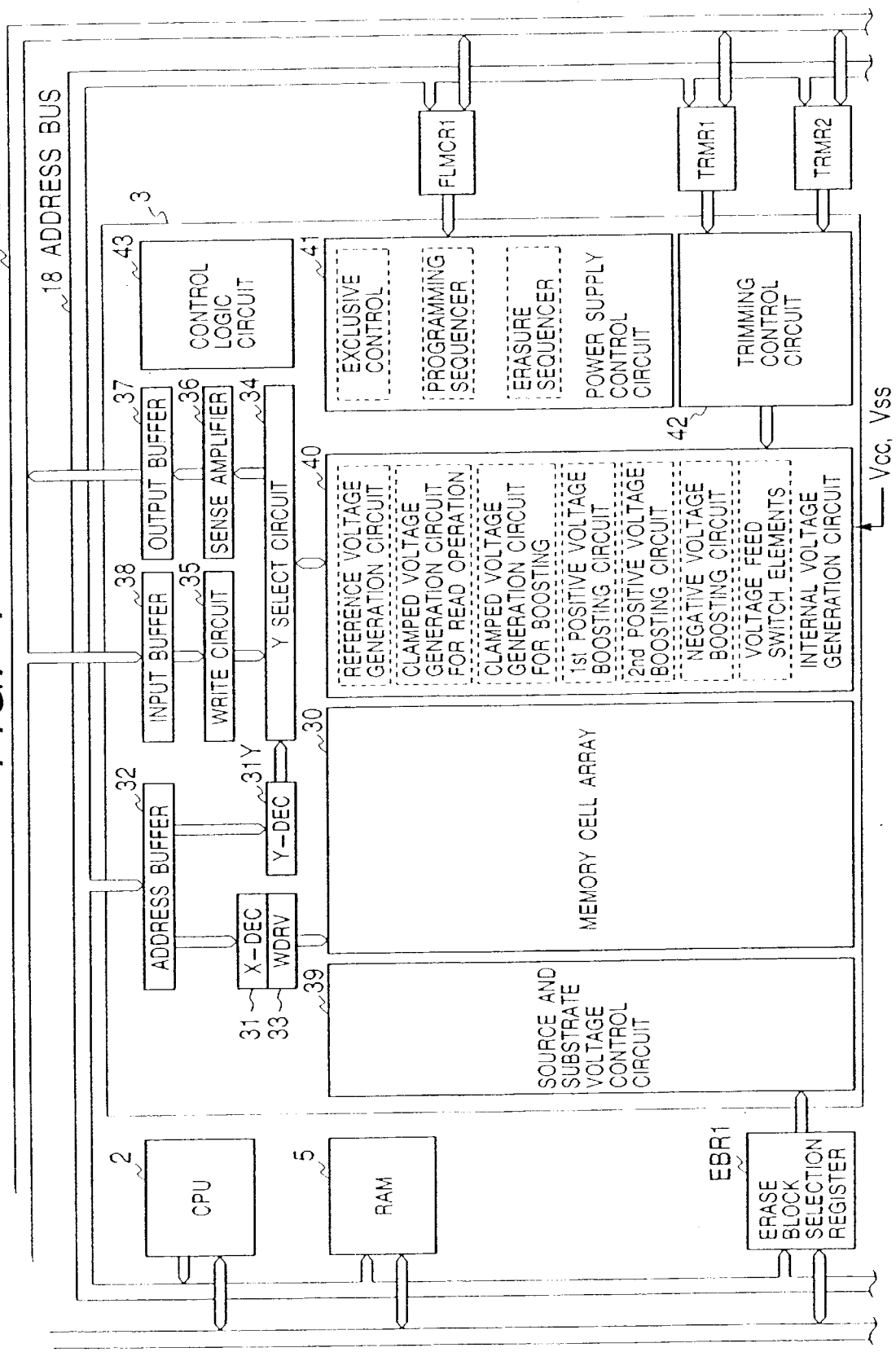
FIG. 4 is an overall block diagram of a flash memory incorporated in the microcomputer.

FIG. 4 is an overall block diagram of the flash memory 3 and flash memory control register 4. The flash memory 3 shown in FIG. 4 is indicated as FLE0 in FIG. 3, one of the flash memories furnished. The other flash memory FLE1 is identical in constitution and is thus omitted from FIG. 4.

In FIG. 4, reference numeral 17 denotes the data bus, and 18 denotes the address bus. The address bus 18 and data bus 17 are shared illustratively by the CPU 2, RAM 5 and flash memories 3. The control register in FIG. 3 is made up of an erasure block designation register EBR1, a programming control register FLMCR1, and reference voltage trimming control registers TRMR1 and TRMR2. The control registers EBR1, FLMCR1, TRMR1 and TRMP2 are made accessible under control of the CPU 2. Access to the registers TRMR1 and TRMR2 by the CPU 2 is subject to limitations, as will be described later.

A large number of non-volatile memory cells are arranged in memory cell arrays 30. Although not shown, the non-volatile memory cells each have a source, a drain, a floating gate and and control gate, and their gate oxide film (i.e., insulating film) is made sufficiently thin to let tunneling currents flow under the tunneling effect. The source is connected to a source line, the drain to a bit line, and the control gate to a word line. An X decoder (X-DEC) 31 generates a word line selection signal by decoding an X address signal admitted to an address buffer 32 from the address bus 18. A word driver (WDRV) 33 drives the word line selected by the word line selection signal to a predetermined selection level in line with an operation mode in effect (programming, erasure, reading, etc.). The bit line selected by a Y selector 34 is connected either to a programming circuit 35 or to a sense amplifier 36. The sense amplifier 36 detects data read from a memory cell and supplies an output buffer 37 with data representing the logic value of the read data. The output buffer 37 places its data onto the data bus 17 in accordance with a data output instruction. The programming circuit 35 supplies the bit line selected by the Y selector 34 with a programming voltage corresponding to the write data admitted to an input buffer 38 from the data bus 17. A Y decoder (Y-DEC) 31Y generates a selection signal for the Y selector 34 by decoding a Y address signal admitted to the address buffer 32 from the address bus 18. A source and substrate voltage control circuit 39 selects the source line for an erasure block designated by the erasure block designation register EBR1, and controls a substrate voltage for the memory cell arrays 30 in keeping with erasure or programming.

In FIG. 4, reference numeral 40 denotes a power supply circuit (i.e., internal voltage generation circuit) for the flash memories. Operating on the single external power supply voltage Vcc, the power supply circuit 40 generates high voltages for programming and erasure as well as operation voltages for a read system. The power supply circuit 40 includes a reference voltage generation circuit, a clamped voltage generation circuit for a read operation, a clamped voltage generation circuit for voltage boosting, a first positive voltage boosting circuit, a second positive voltage boosting circuit, a negative voltage boosting circuit, and a group of voltage supply switches for selecting and supplying these voltages for use by the internal circuits of the flash memories 3.

A trimming control circuit 42 is a control circuit that adjusts power supply circuit characteristics in keeping with process-dependent variations. The trimming control circuit 42 is given control data from the reference voltage trimming register TRMR1 and boosted voltage trimming register TRMR2. Various operation voltages generated by the power supply circuit 40 are fed selectively to the source and substrate voltage control circuit 39, programming circuit 35 and word driver 33 in accordance with the flash memory operation in effect. Programming and erasure sequences for such power supplies are provided by a power supply control circuit 41. The control circuit 41 possesses programming and erasures sequences, among others. The programming control register FLMCR1 furnishes control data for effecting the programming and erasure sequences. A circuit block 43 constitutes other control logic for the flash memories 3.

Figure 5:
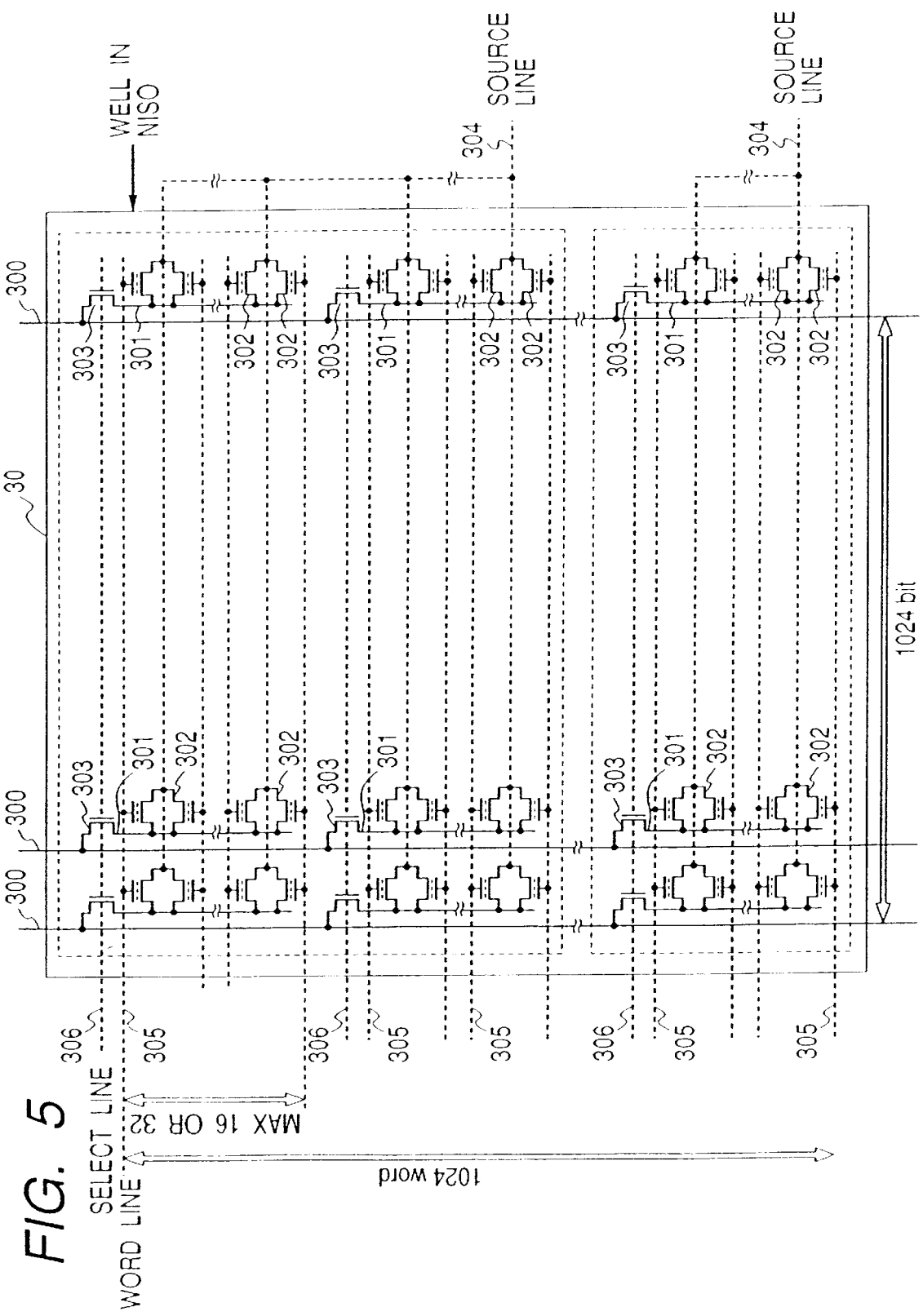
FIG. 5 is a circuit diagram of a memory cell array.

FIG. 5 shows an example of the memory cell arrays 30. The structure of FIG. 5 is illustratively formed of main-bit lines 300 and sub-bit lines 301. Each non-volatile memory cell 302 has its drain connected to a sub-bit line 301. The main-bit lines 300 and sub-bit lines 301 are made to conduct selectively by selective MOS transistors 303. Each block of non-volatile memory cells 302 has sources thereof connected in common to a suitable source line 304. Reference numeral 305 denotes word lines, and 306 denotes select lines of the selective MOS transistors 303.

Figure 6:
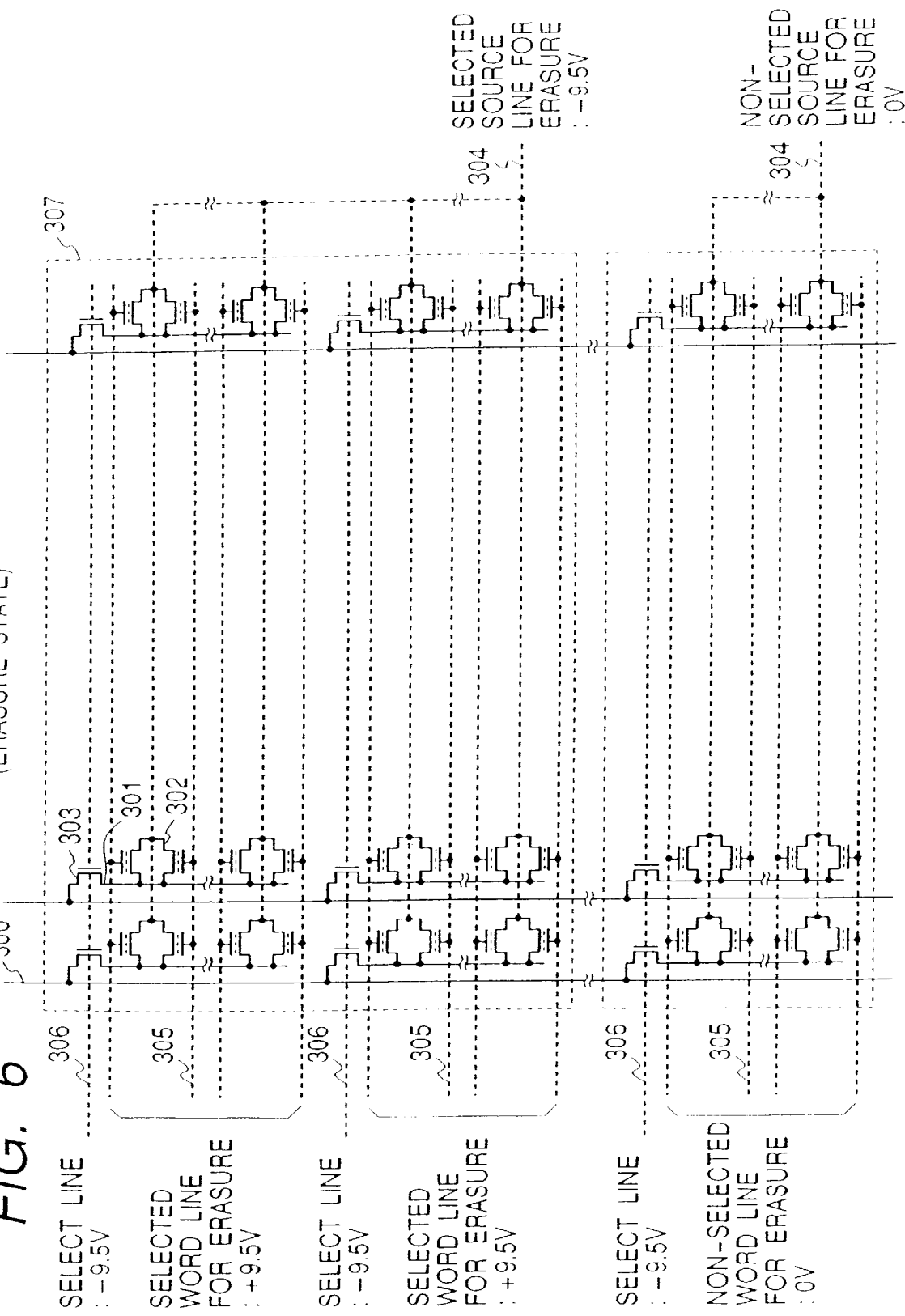
FIG. 6 is a circuit diagram of a flash memory supplied with voltages for erasure.

FIG. 6 is a circuit diagram of a flash memory supplied with voltages, such as, for erasure. A minimum increment of erasure is a block of memory cells with their sources connected in common to a single source line. A selected source line for erasure is given −9.5 V, a select line 306 is supplied −9.5 V, a selected word line for erasure bears 9.5 V, and a non-selected word line for erasure carries 0 V (ground potential Vss). The application of the above voltages injects electrons into the floating gates of the non-volatile memory cells 302 in an erasure-targeted block 307. This raises the threshold voltage of the non-volatile memory cells in question. That is, data is erased by resorting to the tunneling of electrons from drains (sources) and channels to floating gates through the gate insulating film.

Figure 7:
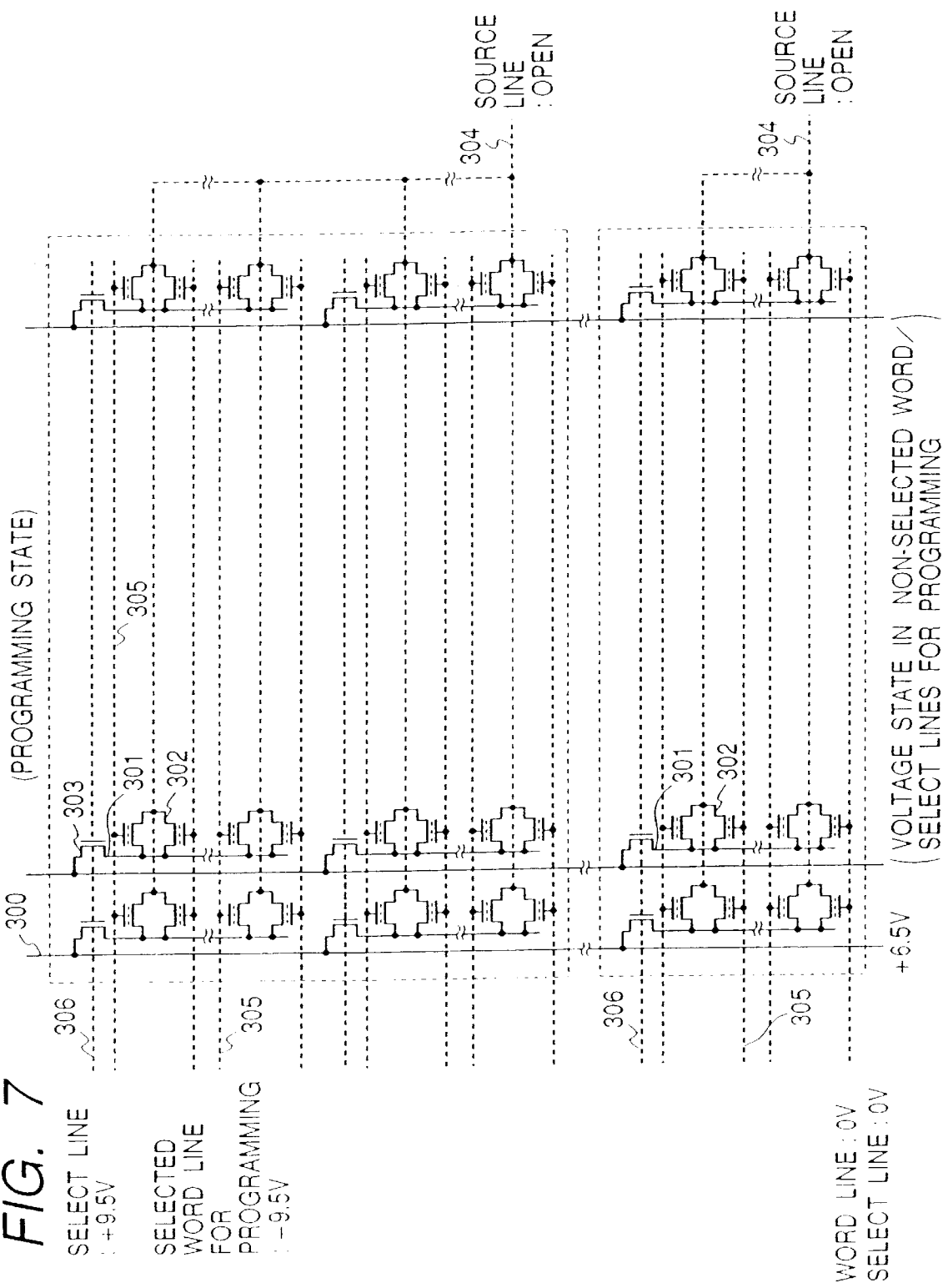
FIG. 7 is a circuit diagram of a flash memory supplied with voltages for programming.

FIG. 7 is a circuit diagram of a flash memory supplied with voltages, such as for programming. Programming is carried out in increments of word lines. A selected word line for programming is supplied with −9.5 V, a selected bit line for programming is fed with 6.5 V, a non-selected bit line for programming bears 0 V, a selected select line for programming is given 9.5 V, and each source line is left open (floating). The application of the above voltages causes electrons to leave the floating gates of the non-volatile memory cells 302 selected for programming, thereby lowering the threshold voltage for the memory cells in question. That is, programming of data is carried out by use of the tunneling of electrons from floating gates to drains (sources) and channels through the gate insulating film.

Figure 8:
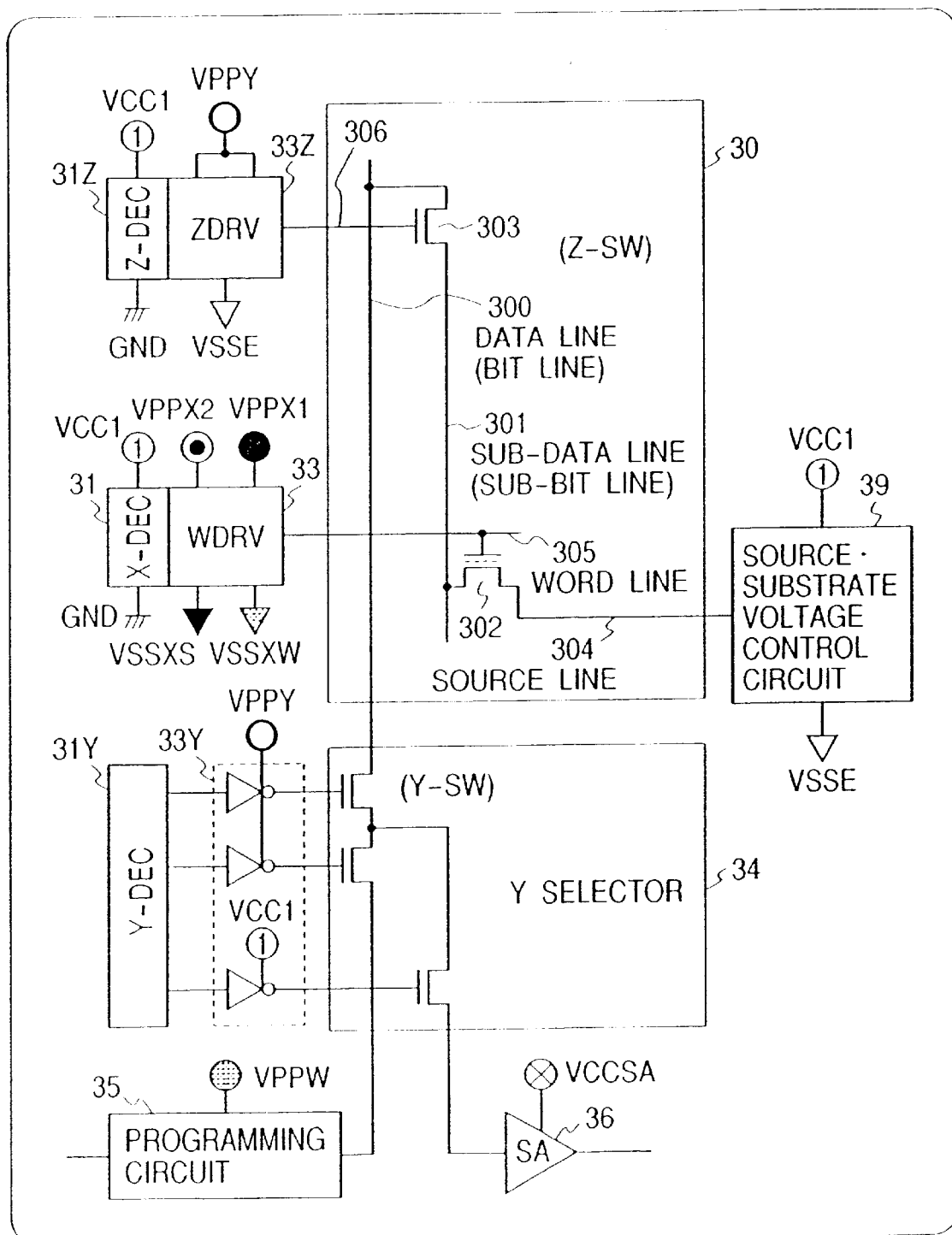
FIG. 8 is a block diagram of a flash memory comprising operation voltage supplies.

FIG. 8 is a block diagram of a flash memory comprising operation voltage supplies. In FIG. 8, reference numeral 33Z denotes a driver (ZDRV) for the select line 306. The driver 33Z is supplied with a decode signal from a Z decoder (Z-DEC) 31Z that decodes an address signal assigned for block selection The Z driver 33Z drives the select line in accordance with a selection signal output by the Z decoder 31Z. Reference numeral 33Y denotes a Y select driver which determines the level of a switch control signal for the Y selector 34. FIG. 4 leaves out the Y select driver 33Y, Z driver 33Z, and Z decoder 31Z.

FIG. 9 lists the symbols, names and descriptions of the operation voltage supplies shown in FIG. 8. How voltages from these power supplies and their operations are related is shown illustratively in FIG. 10. FIG. 11 summarizes voltage levels that may be taken by the operation voltage supplies in FIG. 8. As indicated, positive voltage boosting generates 9.5 V and 6.5 V, while negative voltage boosting generates −9.5 V.

Power Supply Circuit

Figure 1:
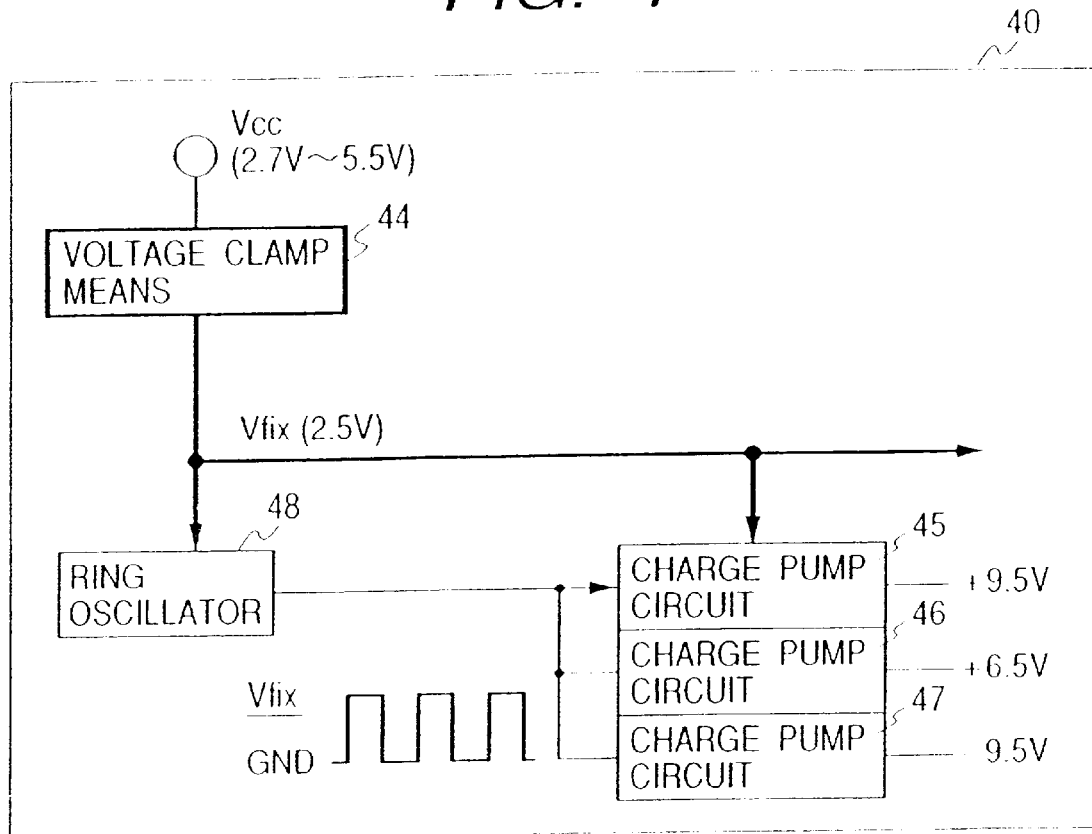
FIG. 1 is a schematic block diagram outlining key parts of a power supply circuit.

FIG. 1 outlines key parts of the power supply circuit 40. The power supply circuit 40 includes voltage clamp means 44 for clamping an output voltage to a first voltage Vfix (2.5 V) lower than the external supply voltage Vcc (2.7 V to 5.5 V) through the use of a reference voltage with a low dependence on a supply voltage. Also included in the power supply circuit 40 is a boosting circuit which operates on the first voltage Vfix (also called the clamped voltage Vfix) and which comprises three charge pump circuits 45, 46 and 47 and a ring oscillator 48 common to the three circuits. The charge pump circuit 45 and the ring oscillator 48 constitute a first positive voltage boosting circuit that generates a positively boosted voltage of 9.5 V from the clamped voltage Vfix. The charge pump circuit 46 and the ring oscillator 48 make up a second positive voltage boosting circuit that generates a positively boosted voltage of 6.5 V from the clamped voltage Vfix. The charge pump circuit 47 and the ring oscillator 48 form a negative voltage boosting circuit that generates a negatively boosted voltage of −9.5 V from the clamped voltage Vfix.

Figure 2:
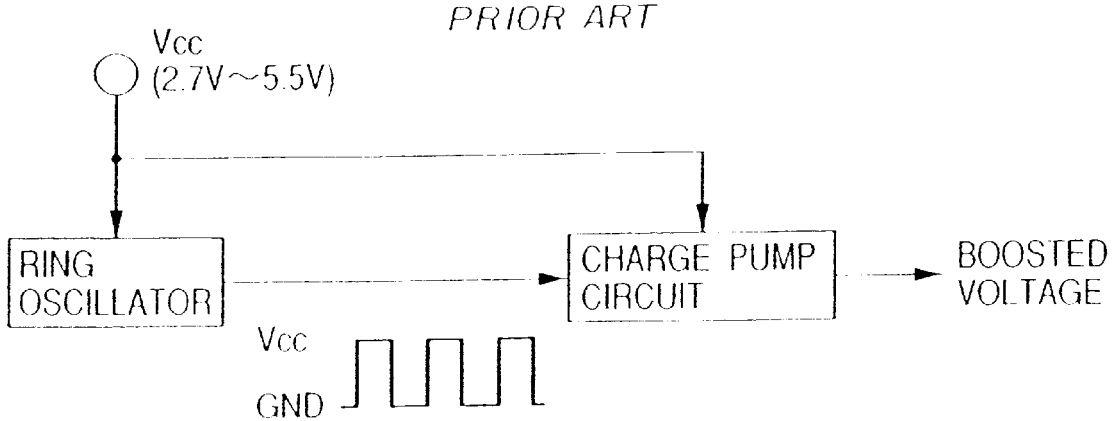
FIG. 2 is a block diagram of a conventional power supply circuit comparable to that in FIG. 1.

It is shown above that the voltage clamp means 44 generates the clamped voltage Vfix having a low dependence on a supply voltage, and that the voltage Vfix is clamped to a voltage (2.5 V) lower than the single supply voltage Vcc which is furnished externally and allowed to vary between 2.7 V and 5.5 V. Thus the voltages boosted for programming and erasure by the positive and negative voltage boosting circuits operating on the clamped voltage Vfix are stable voltages that are independent of the external supply voltage Vcc. In a conventional setup shown in FIG. 2 as a comparative example, a ring oscillator and a charge pump circuit operate from a power supply constituted by the external power supply voltage Vcc. This makes it inevitable for the boosted voltage to vary depending on the external supply voltage Vcc.

Clamped Voltage Generation Unit

Figure 12:
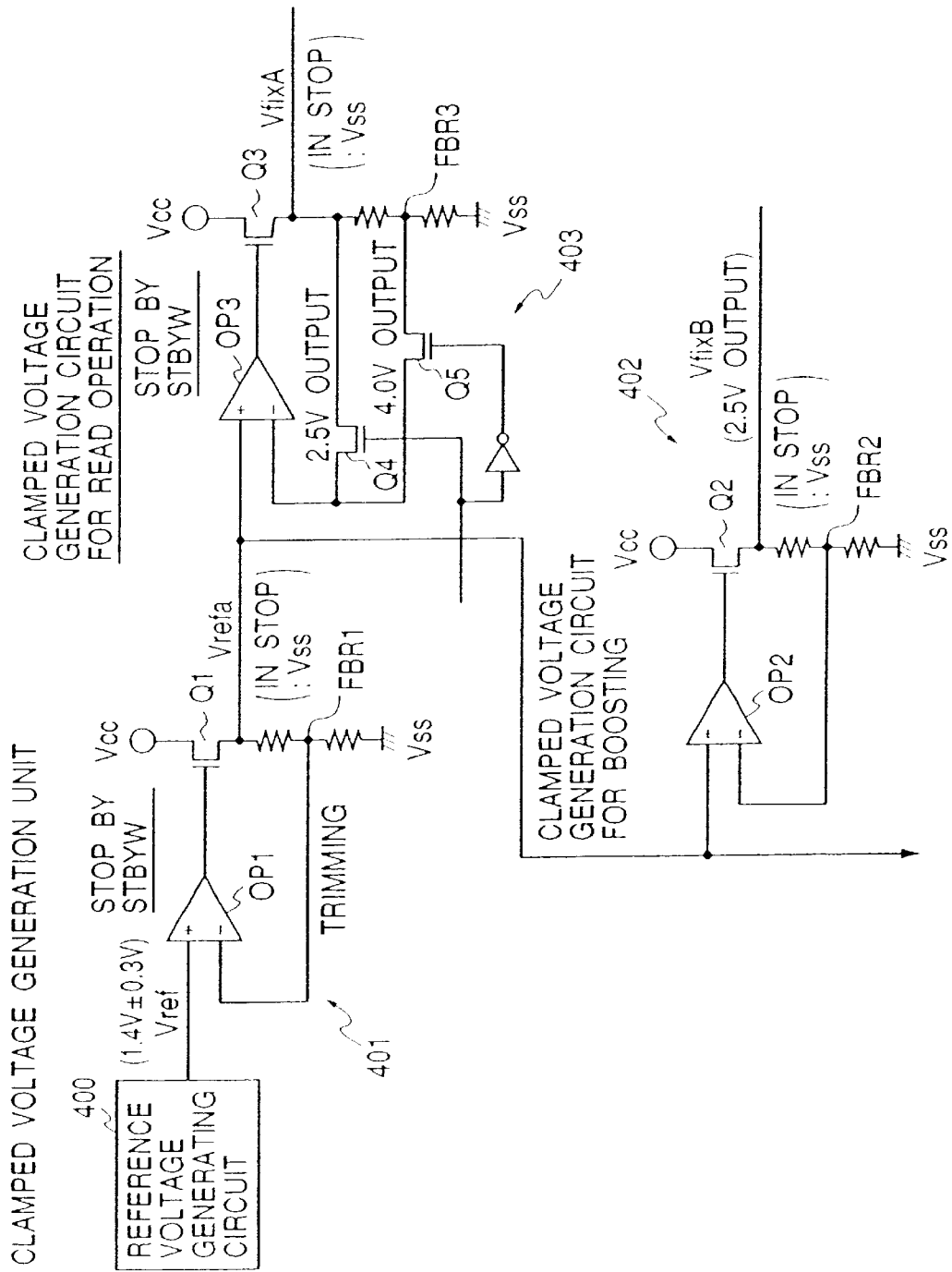
FIG. 12 is a circuit diagram of typical voltage clamp means.

FIG. 12 illustrates an example of the voltage clamp means 44. The voltage clamp means 44 comprises a reference voltage generation circuit 400, a first constant voltage generation circuit 401, a second constant voltage generation circuit (clamped voltage generation circuit for boosting) 402, and a third low-voltage generation circuit (clamped voltage generation circuit for read operation) 403.

The reference voltage generation circuit 400 generates a reference voltage Vref with a low dependence on a supply voltage by resorting illustratively to the band gap of silicon. The reference voltage generation circuit 400 operates on the external power supply voltage Vcc. This kind of reference voltage generation circuit is well known in the art, and so its detailed circuit constitution will riot be described further. In this example, the reference voltage Vref is assumed to be 1.4 V±0.3 V.

The first constant voltage generation circuit 401 places an output circuit under control for negative feedback to a clamped voltage Vrefa with respect to the reference voltage Vref. Specifically, a source-follower circuit made of an n-channel MOS transistor Q1 and a feedback resistance circuit (ladder resistance circuit) FBR1 is provided as the output circuit. The first constant voltage generation circuit 401 also includes a CMOS operational amplifier OP1 whose non-inverting input terminal (+) receives the reference voltage Vref. The CMOS operational amplifier OP1 has its inverting input terminal (−) supplied with a feedback signal from the output circuit. The output of the operational amplifier OP1 is used to control the MOS transistor Q1 in conductance. The clamped voltage Vrefa is furnished as a constant voltage determined by the potential dividing ratio of the feedback resistance circuit FBR1 and by the reference voltage Vref. Logically, the clamped voltage Vrefa is not dependent on the power supply voltage Vcc. In this example, the clamped voltage Vrefa is adjusted to be 2.5 V by the feedback resistance circuit FBR1.

Figure 16:
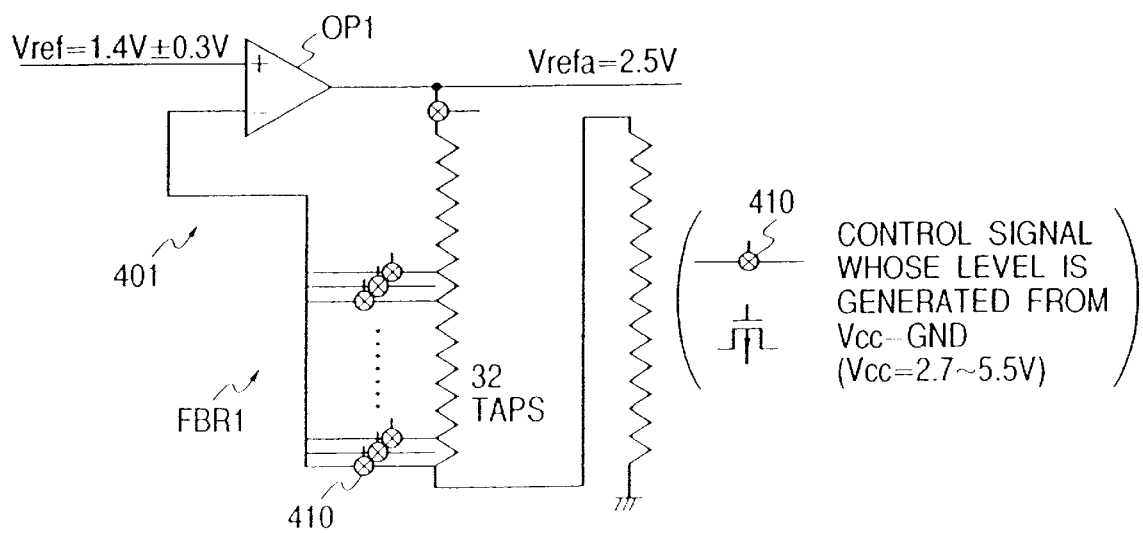
FIG. 16 is a circuit diagram of a trimming capacitor circuit for a first constant voltage generating circuit.
Figure 17:
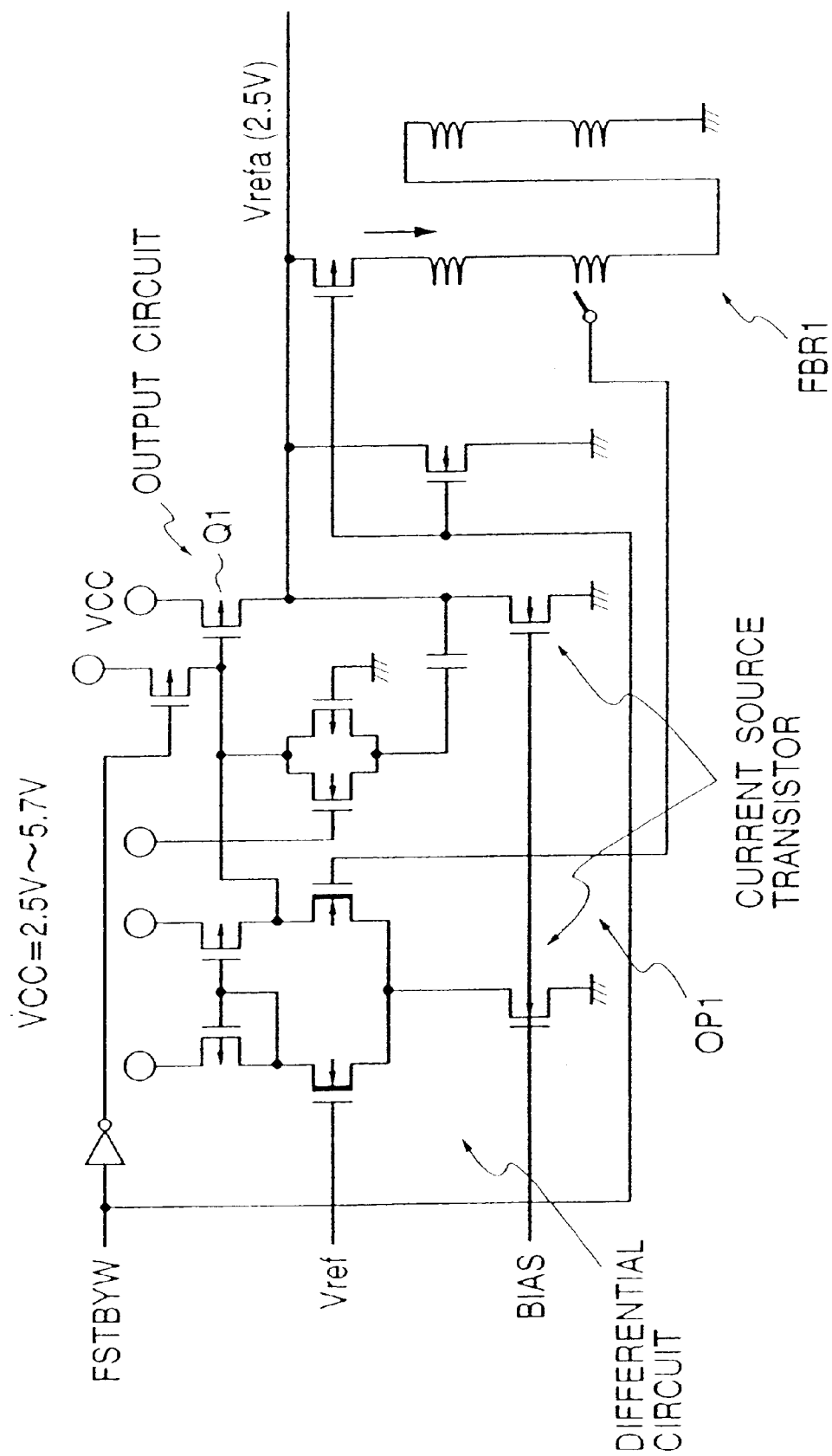
FIG. 17 is a detailed circuit diagram of the first constant voltage generating circuit.

More details of the first constant voltage generation circuit 401 are shown in FIGS. 16 and 17. As illustrated in FIG. 16, the potential dividing ratio of the feedback resistance circuit FBR1 may be selected by a switch 410. That is, the feedback resistance circuit FBR1 constitutes a trimming capacitor circuit capable of adjusting the resistance potential dividing ratio. In FIG. 17, a signal BIAS is a signal which, output by a bias circuit not shown, applies bias to a differential amplifier and to current source transistors of the output circuit. A signal FSTBYW is a stand-by signal which determines the status of internal nodes in the low power consumption mode of the microcomputer 1 and which cuts off unnecessary through current paths.

The second constant voltage generation circuit 402 places an output circuit under control for negative feedback to a clamped voltage VfixB with respect to a reference voltage constituted by the clamped voltage Vrefa. Specifically, a source-follower circuit made of an n-channel MOS transistor Q2 and a feedback resistance circuit FBR2 is provided as the output circuit. The second constant voltage generation circuit 402 also includes a CMOS operational amplifier OP2 whose non-inverting input terminal (+) receives the clamped voltage Vrefa. The CMOS operational amplifier OP2 has its inverting input terminal (−) supplied with a feedback signal from the output circuit. The output of the operational amplifier OP2 is used to control the MOS transistor Q2 in conductance. The clamped voltage VfixB is furnished as a constant voltage determined by a potential dividing ratio of the feedback resistance circuit FBR2 and by the clamped voltage Vrefa. Logically, the clamped voltage Vrefa is not dependent on the power supply voltage Vcc. In this example, the potential dividing ratio of the feedback resistance circuit FBR2 is determined so that the clamped voltage VfixB will be 2.5 V. The clamped voltage VfixB in FIG. 12 corresponds to the voltage Vfix in FIG. 1.

The third constant voltage generation circuit 403 places an output circuit under control for negative feedback to a clamped voltage VfixA with respect to a reference voltage constituted by the clamped voltage Vrefa. Specifically, a source-follower circuit made of an n-channel MOS transistor Q3 and a feedback resistance circuit FBR3 is provided as the output circuit. The third constant voltage generation circuit 403 also includes an operational amplifier OP3 whose non-inverting input terminal (+) receives the clamped voltage Vrefa. The operational amplifier OP3 has its inverting input terminal (−) supplied with a feedback signal from the output circuit. The output of the operational amplifier OP3 is used to control the MOS transistor Q3 in conductance. The feedback signal is fed back either through an n-channel MOS transistor Q4 for outputting 2.5 V or through an n-channel MOS transistor Q5 for outputting 4.0 V. The clamped voltage VfixA is furnished as a substantially constant voltage determined by a potential dividing ratio of the feedback resistance circuit FBR3 and by the clamped voltage Vrefa. Logically, the clamped voltage Vrefa is not dependent on the power supply voltage Vcc. In this example, the potential dividing ratio of the feedback resistance circuit FBR3 is determined so that the clamped voltage VfixA will be 2.5 V when the transistor Q4 is selected, and 4.0 V when the transistor Q5 is selected. The clamped voltage VfixA is used as the operating voltage for a read system. The clamped voltage VfixA is set for either 2.5V or 4.0V depending on the operation mode in effect. In the case of a read operation, for example, the clamped voltage VfixA is set for 4.0 V with a view to alleviating word line disturbance. For an erase-verify operation or a write-verify operation, on the other hand, the clamped voltage VfixA is set for 2.5 V so that the write or erase level will not be dependent on the supply voltage Vcc.

The clamped voltage VfixB serves as the operation voltage that is tapped to generate boosted voltages for programming and erasure. As such, the clamped voltage VfixB is separated from the clamped voltage VfixA for other read operations. To execute programming or erasure requires a relatively large current that is supplied by a boosting circuit using an appreciably large current. When the power supply for the boosting circuit is separated from the other power supplies, it is possible to minimize any adverse effects exerted on the other circuits by supply voltage fluctuations stemming from boosting operations.

Boosting Circuits

Figure 13:
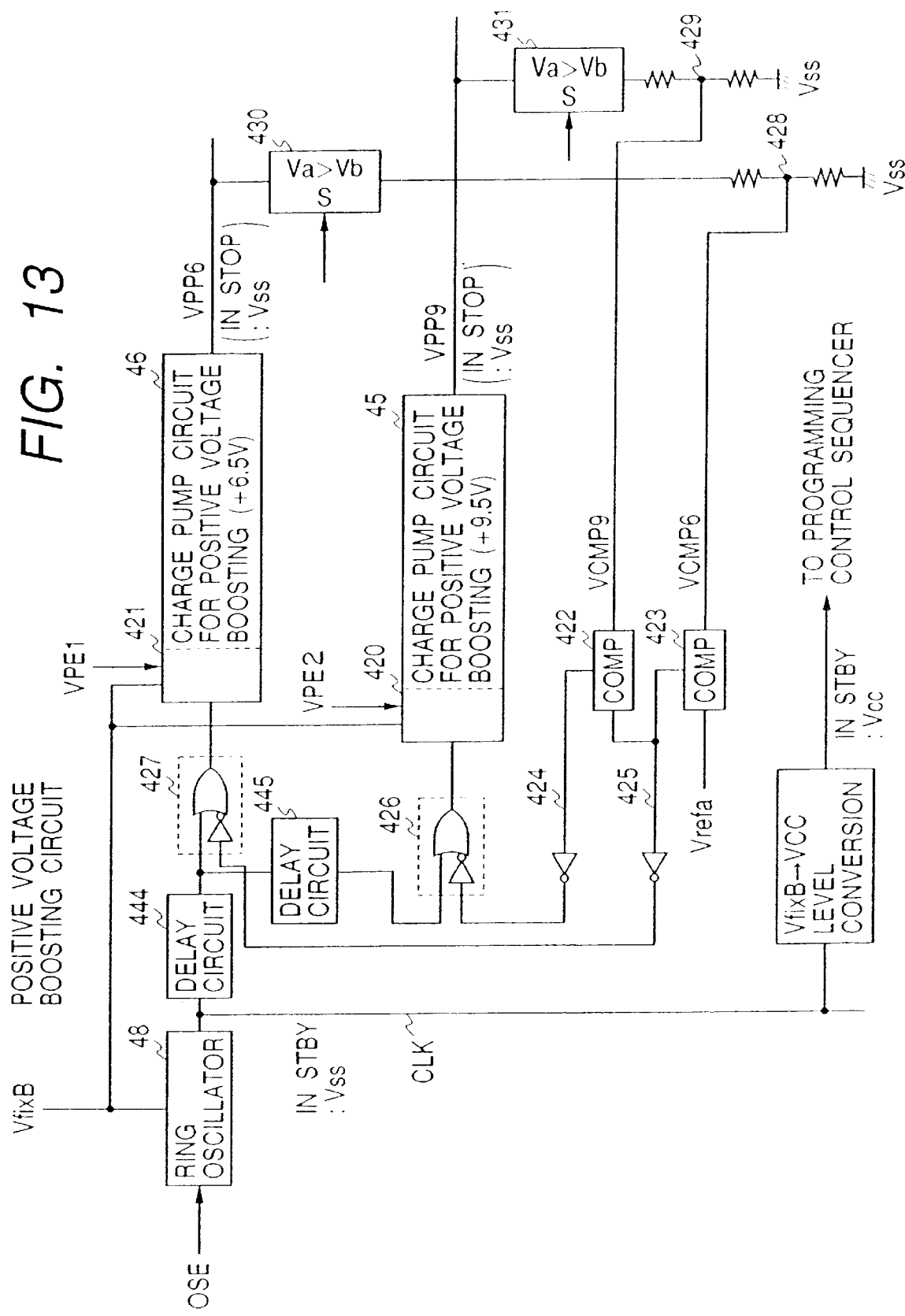
FIG. 13 is a circuit diagram of a first and a second positive voltage boosting circuit.

FIG. 13 is a circuit diagram of the charge pumps 45 and 46 which are representative of the first and the second positive voltage boosting circuits, respectively. Although not shown, each of tyke charge pump circuits 45 and 46 comprises a plurality of boosting nodes each having an MOS transistor and a capacitor element connected therein. The MOS transistors and capacitors combine to provide a charge pump action that generates high voltages. Clock drivers 420 and 421 generate drive signals having a plurality of phases, the signals causing the charge pump circuits 45 and 46 to perform charge pump operations. The clock drivers 420 and 421 operate from a power supply constituted by the clamped voltage VfixB. The drive signals are staggered in their phases so as to switch the plurality of MOS transistors. One terminal of each capacitor receives regularly varied voltages so that the other terminal outputs correspondingly varied voltages that are transmitted downstream via the MOS transistors. The drive signals are generated in synchronism with a clock signal CLK output by the ring oscillator 48. Boosted voltages VPP6 and VPP9 generated by the charge pump circuits 46 and 45 are maintained at predetermined levels by comparators 422 and 423. The comparators 422 and 423 are supplied with voltages VCMP6 and VCMP9 from resistance circuits 428 and 429 having divided the boosted voltages VPP6 and VPP9. The voltages VCMP6 and VCMP9 are compared with the clamped voltage Vrefa. When the boosted voltages reach predetermined voltage levels (VPP6=6.5 V, VPP9=9.5 V), the voltages VCMP6 and VCMP9 are raised above the voltage Vrefa. That state is detected by the comparators 422 and 423 which then invert detection signals 424 and 425 from the Low to the High level. The detection signals 424 and 425 are OR'ed with the clock signal CLK by OR gates 426 and 427, the results being fed to the clock drivers 420 and 421. In this manner, when the boosted voltages VPP6 and VPP9 reach their predetermined levels, the outputs of the OR gates 426 and 427 are fixed to the High level. While the High level is in effect, the boosting operations of the charge pump circuits 45 and 46 are temporarily halted. Reference numerals 430 and 431 denote switching circuits that are cut off upon completion of the boosting operations.

Figure 14:
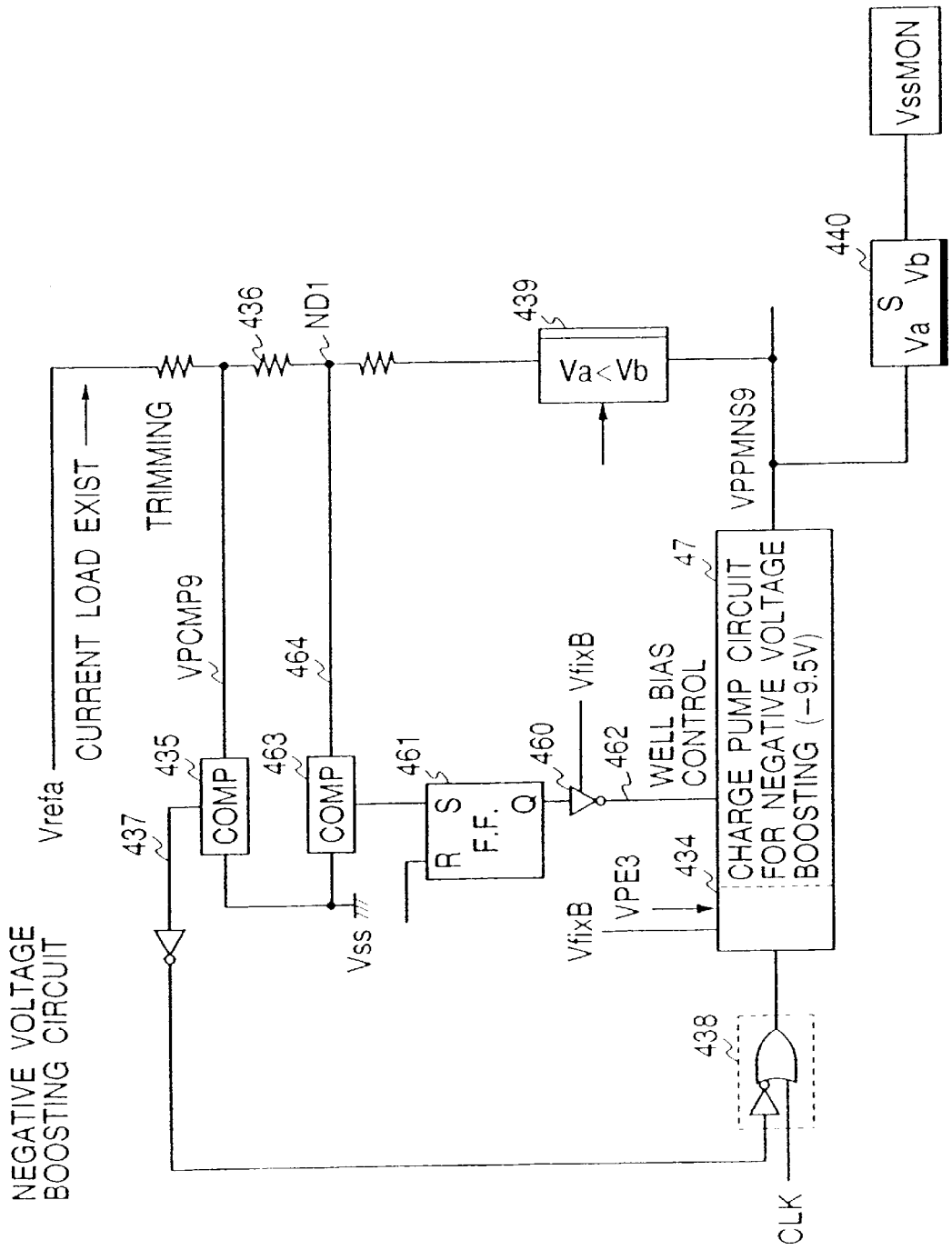
FIG. 14 is a circuit diagram of a typical negative voltage boosting circuit.

FIG. 14 is a circuit diagram of the charge pump circuit 47 representative of the negative voltage boosting circuit, together with related peripheral circuits. Although not shown, the charge pump circuit 47 has a plurality of boosting nodes, each having an MOS transistor and a capacitor connected therein. The MOS transistors and capacitors combine to provide a charge pump action that generates negative high voltages. A clock driver 434 generates drive signals having a plurality of phases, the signals causing the charge pump circuit 47 to perform charge pump operations. The clock driver 434 operates from a power supply constituted by the clamped voltage VfixB. The drive signals have their phases staggered so as to switch the plurality of MOS transistors. One terminal of each capacitor receives regularly varied voltages so that the other terminal outputs correspondingly varied voltages that are transmitted downstream via the MOS transistors. The drive signals are generated in synchronism with the clock signal CLK output by the ring oscillator 48 in FIG. 13. A boosted voltage VPPMNS9 generated by the charge pump circuit 47 is maintained at a predetermined level by a comparator 435. The comparator 435 is supplied with a voltage VPCMP9 from a resistance circuit 436 having divided the boosted voltage VPPMNS9. The voltage VPPMNS9 is compared with the ground potential Vss. When the boosted voltage reaches a predetermined voltage level (VPPMNS9=−9.5 V), the voltage VPCMP9 is lowered below the ground potential Vss. That state is detected by the comparator 435 which then inverts a detection signal 437 from the Low to the High level. The detection signal 437 is OR'ed with the clock signal CLK by an OR gate 438, the result being fed to the clock driver 434. In this manner, when the boosted voltage VPPMNS9 reaches its predetermined level, the output of the OR gate 438 is fixed to the High level. While the High level is in effect, the boosting operation of the charge pump circuit 47 is temporarily halted. Reference numeral 439 denotes a switching circuit that is cut off upon completion of the boosting operation.

Figure 15:
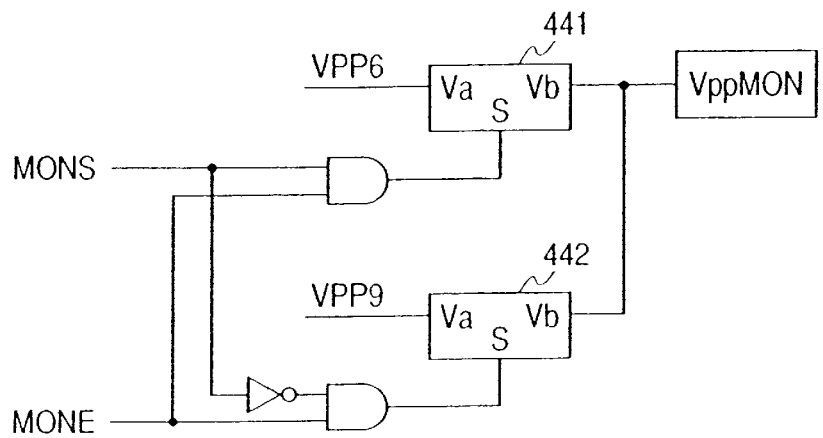
FIG. 15 is a circuit diagram of a positive voltage monitor circuit for selectively monitoring positively boosted voltages.

The negatively boosted voltage VPPMNS9 from the charge pump circuit 47 may be monitored through the monitor terminal VssMON. Reference numeral a 440 indicates a switching circuit that is turned on in the test mode. As shown in FIG. 15, the positively boosted voltages VPP6 and VPP9 may be monitored selectively through the monitor terminal VppMON. Reference numerals 441 and 442 represent switching circuits that allow the positively boosted voltages VPP6 and VPP9 to be sent to the monitor terminal VppMON. A signal MONE is an enable signal which, when brought High, designates the monitoring of a boosted voltage through the monitor terminal VppMON. A signal MONS is used to designate which of the voltages VPP6 and VPP9 is to be monitored. The switching circuits 441 and 442 are turned on in a mutually exclusive manner depending on the status of the signals MONE and MONS in test mode, whereby the boosted voltage VPP6 or VPP9 is monitored as desired.

In FIG. 13, a signal OSE is a start designation signal that instructs the ring oscillator 48 to start oscillating. A signal VPE1 is used to instruct the clock driver 421 and charge pump circuit 46 to start a boosting operation. A signal VPE2 instructs the clock driver 420 and charge pump circuit 45 to start a boosting operation. In FIG. 14, a signal VPE3 causes the clock driver 434 and charge pump circuit 47 to start a boosting operation.

Figure 18:
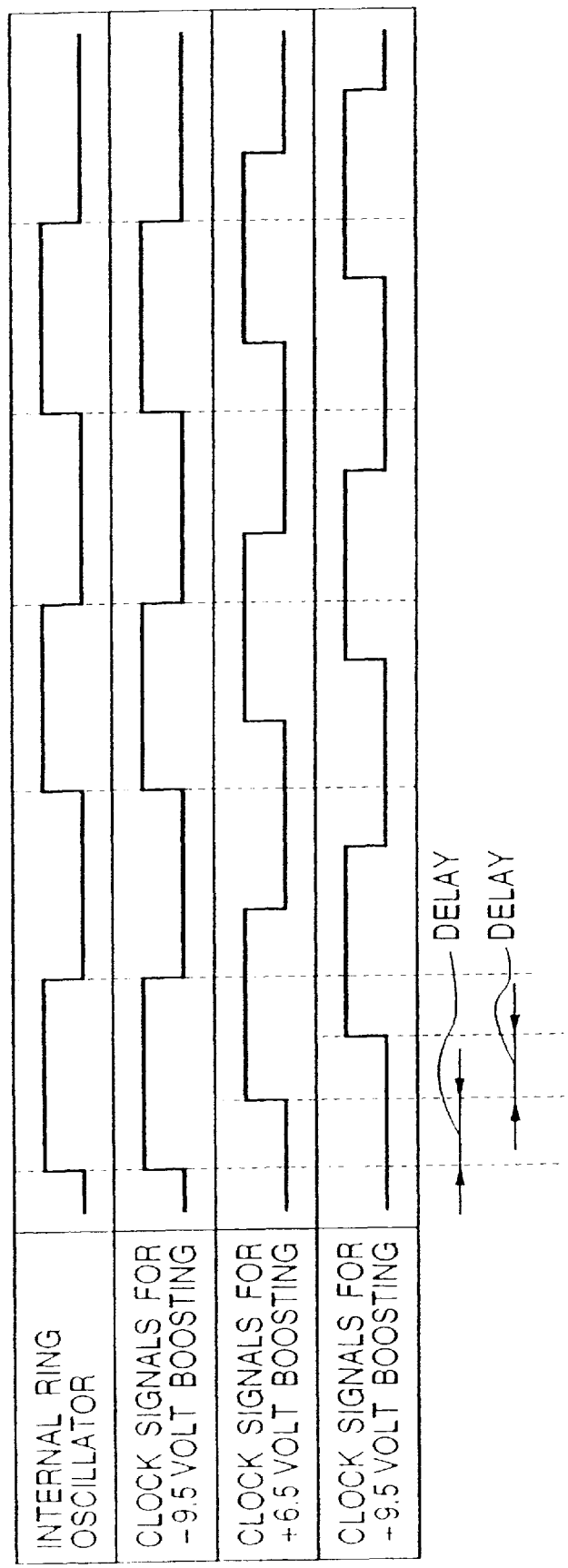
FIG. 18 is a waveform chart of clock signals for boosting.

The clock drivers 420, 421 and 434 operate from a common power supply constituted by the clamped voltage VfixB, and share the single ring oscillator 48 as their clock source. In this setup, as shown in FIG. 13, the clock driver 421 of the charge pump circuit 46 is supplied with the clock signal CLK via a delay circuit 444. The clock driver 420 of the charge pump circuit 45 is ted with the clock signal CLK via two serially connected delay circuits 444 and 445. On the other hand, as shown in FIG. 14, the clock driver 434 of the charge pump circuit 47 receives the clock signal CLK without the intervention of delay circuits. With this arrangement in effect, the clock signals CLK output by the ring oscillator 48 are staggered in phase as illustrated in FIG. 18 when they are fed to the clock drivers 434, 421 and 420 to boost voltages to −9.5 V, +6.5 V and +9.5 V respectively. The drive signals generated by the clock drivers 434, 421 and 420 for the charge pump circuits 47, 46 and 45 are synchronized with the clock signals that are staggered in phase as described. That is, the clock drivers 434, 421 and 420 have their transistors switched in synchronism with these clock signals, and currents flowing through the circuits vary in synchronism with the switching operations. Because the clock signals supplied to the clock drivers 434, 421 and 420 are staggered in phase, instantaneous current variations resulting from all clock drivers 434, 421 and 420 is minimized. This translates into keeping boosting operations steady and contributes to stabilizing programming and erasure operations.

Changing the Substrate Bias Voltage for the Charge Pump Circuits

Figure 19:
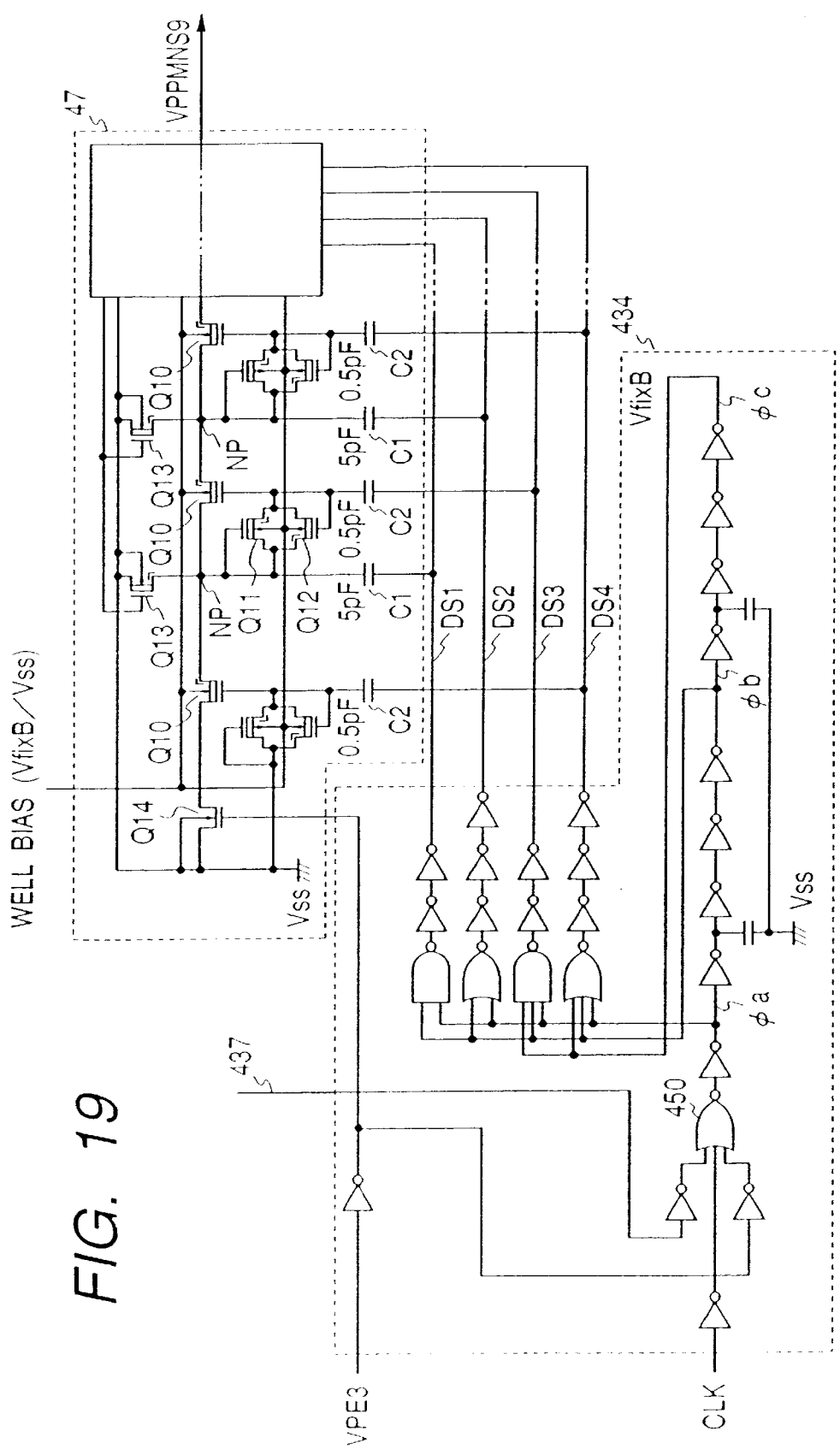
FIG. 19 is a circuit diagram of a charge pump circuit for negative voltage boosting and a clock driver.

FIG. 19 is a circuit diagram of the charge pump circuit 47 for negative voltage boosting and the clock driver 434. In the charge pump circuit 47, part of which is shown in FIG. 19, the components designated NP are boosting nodes. Between two adjacent boosting nodes is a p-channel MOS transistor Q10 for charge transfer purposes. Each boosting node NP is connected to one of the two electrodes of a charge pump capacitor C1. Each MOS transistor Q10 has its gate connected to one electrode of another capacitor C2. P-channel transfer MOS transistors Q11 and Q12 are parallelly arranged between the gate of each MOS transistor Q10 and the immediately upstream boosting node NP. The gate of the MOS transistor is connected to the boosting node NP, and the gate of the MOS transistor Q12 is connected to the gate of the MOS transistor Q10. MOS transistors Q13 and Q14 are provided to initialize the boosting nodes NP. The capacitor C1 is greater in capacitance than the capacitor C2. As described, the charge pump circuit 47 comprises a plurality of unit circuits connected in series, each unit circuit including the MOS transistors Q10 through Q13 as well as the capacitors C1 and C2.

Figure 20:
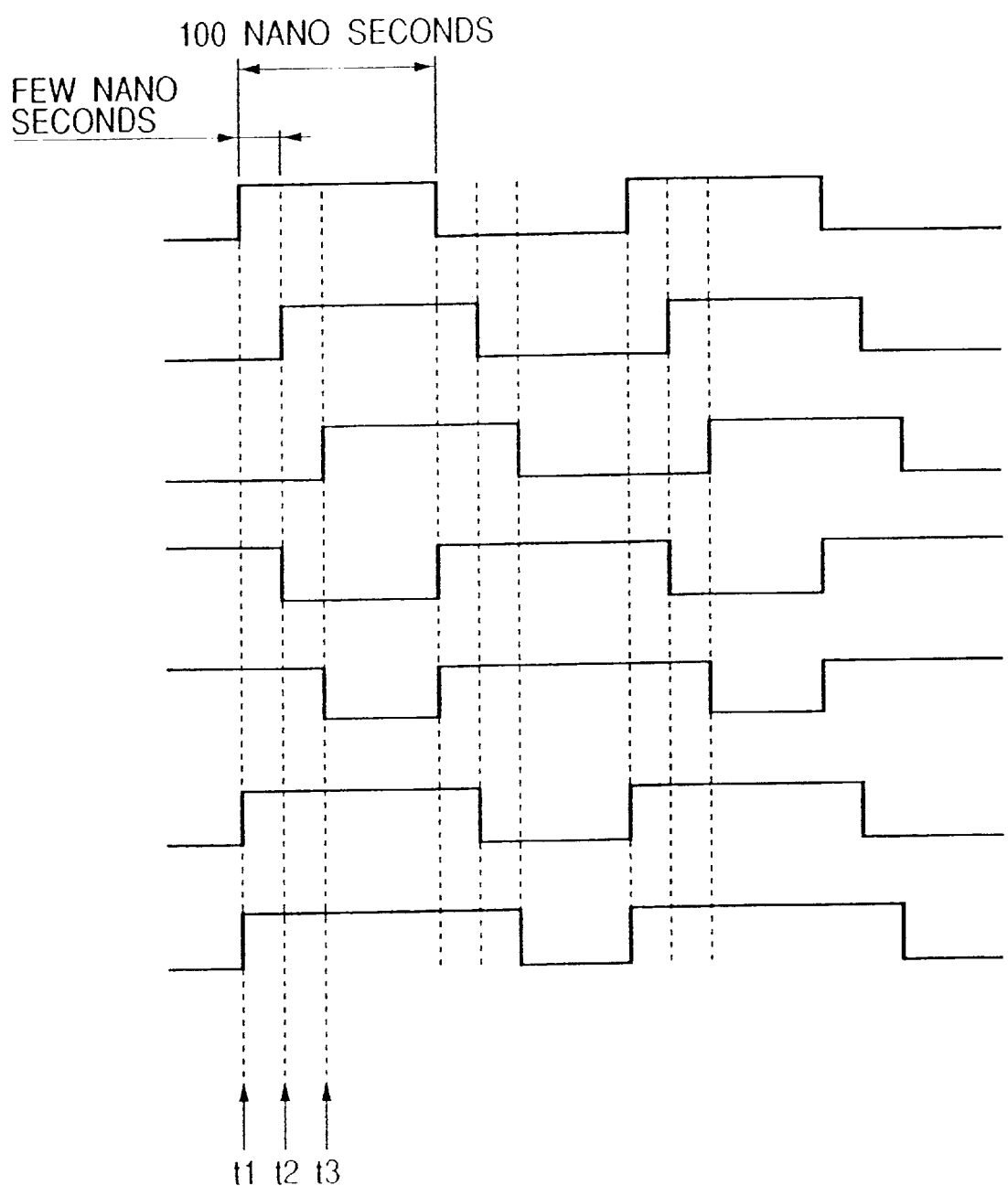
FIG. 20 is a waveform chart of clock and drive signals generated by the logic structure of the clock driver shown in FIG. 19.

The clock driver 434 delays the clock signal CLK successively in order to generate three-phase clock signals φa through φc having different phases. Based on the three phase clock signals φa through φc, the clock driver 434 outputs four drive signals DS1 through DS4. FIG. 20 is a waveform chart of the clock signals φa through φc as the well as drive signals DS1 through DS4 generated by the logic structure of the clock driver 434 shown in FIG. 19.

The drive signals DS1 and DS2 are supplied alternately to the other electrode of the capacitor C1, and the drive signals DS3 and DS4 are fed alternately to the other electrode of the capacitor C2. Illustratively, driving the signal DS4 High (t1) turns off the MOS transistor Q10. When the boosting node level is raised by having the signal DS4 driven High (t1), bringing the signal DS1 Low (t2) to lower the level of the immediately upstream boosting node NP causes the adjacent MOS transistor Q10 to lower the level of its gate via the transistor Q11. Immediately thereafter, bringing the signal DS3 Low (t3) further reduces the level of the boosting node NP in question. The lowered level is shifted through the MOS transistor A10 to the next-stage boosting node NP. This charge pump operation boosts the voltage VPPMNS9 stage by stage to a negative level.

A NOR gate 450 shown in FIG. 19 functionally replaces the OR gate 438 described with reference to FIG. 14.

The drive signals D1 through D4 vary between the ground potential Vss and the clamped voltage VfixB. At the start of a boosting operation, the clamp voltage VfixB is applied to the gates of the MOS transistors Q10, Q11 and Q12 in the charge pump circuit 47. As the boosting operation progresses, the gate voltage drops. This means that, unless the substrate bias voltage common to the MOS transistors Q10, Q11 and Q12 is set at least to the clamped voltage VfixB when the boosting operation is started, the p-n junctions of the transistors may inadvertently be biased in the forward direction leading to malfunction.

In this example, the MOS transistors Q10, Q11 and Q12 are formed in a well region common to them. The substrate bias voltage (well bias voltage) common to the MOS transistors Q10, Q11 and Q12 is set to the clamped voltage VfixB at the start of a boosting operation and is switched to the ground potential Vss halfway during the boosting.

Figure 21:
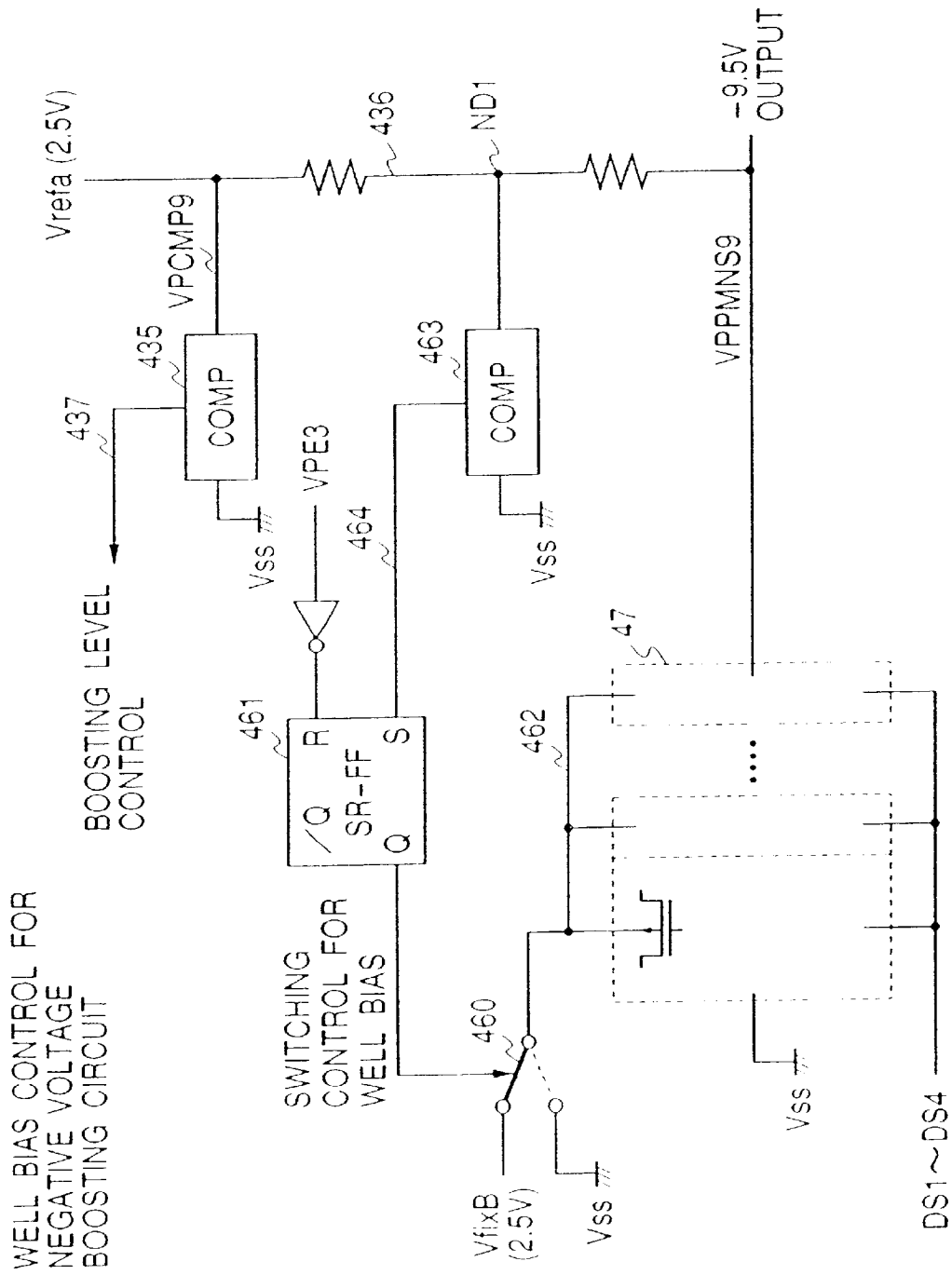
FIG. 21 is a schematic block diagram of an arrangement for switching a substrate bias voltage of the charge pump circuit.

FIG. 21 is a schematic block diagram of a typical arrangement for switching the substrate bias voltage of the charge pump circuit. In FIG. 21, reference numeral 460 denotes switching means for switching the substrate bias voltage either to the clamped voltage VfixB or to the ground potential Vss. The state of the switching means 460 is determined, by the invention is not so limited, by the state of an output terminal Q of a set-reset type flip-flop (SR-FF) 461. A reset terminal R of the flip-flop 461 is supplied with an inverted signal derived from the boosting enable signal VPE3. The flip-flop 461 is reset when the boosting operation is not carried out. In the reset state, the switching means 460 selects the clamped voltage VfixB as the substrate bias voltage 462. A set terminal S of the flip-top 461 is supplied with an output signal 464 from a comparator 463. The comparator 463 is used to monitor if the potential of a potential dividing point ND1 drops below the ground potential Vss. When the boosted voltage VPPMNS9 drops below the ground potential Vss, the potential-dividing point ND1 is set to the ground potential Vss. That is, when the boosted voltage VPPMNS9 becomes lower than the ground potential Vss, the flip-flop 461 is set. This causes the switching means 460 to select the ground potential Vss as the substrate bias voltage 462. In FIG. 14, the switching means 460 is constituted by an inverter that operates on the clamped voltage VfixB and ground potential Vss.

When the substrate bias voltage 462 is switched halfway through a negative boosting operation from the clamped voltage VfixB to the ground potential Vss which is lower than the voltage VfixB, the so-called substrate bias effect reduces the threshold voltage for the MOS transistors Q10, Q11 and Q12. This makes it easier to transfer charges through the MOS transistors Q10, Q11 and Q12 performing charge pump operations. That in turn enhances the efficiency of negatively boosting the target voltage (VPPMNS9=−9.5 V) having the greatest discrepancy in level relative to the operation voltage (VfixB=2.5 V), which shortens the time it takes to obtain the negatively boosted voltage required.

Figure 22:
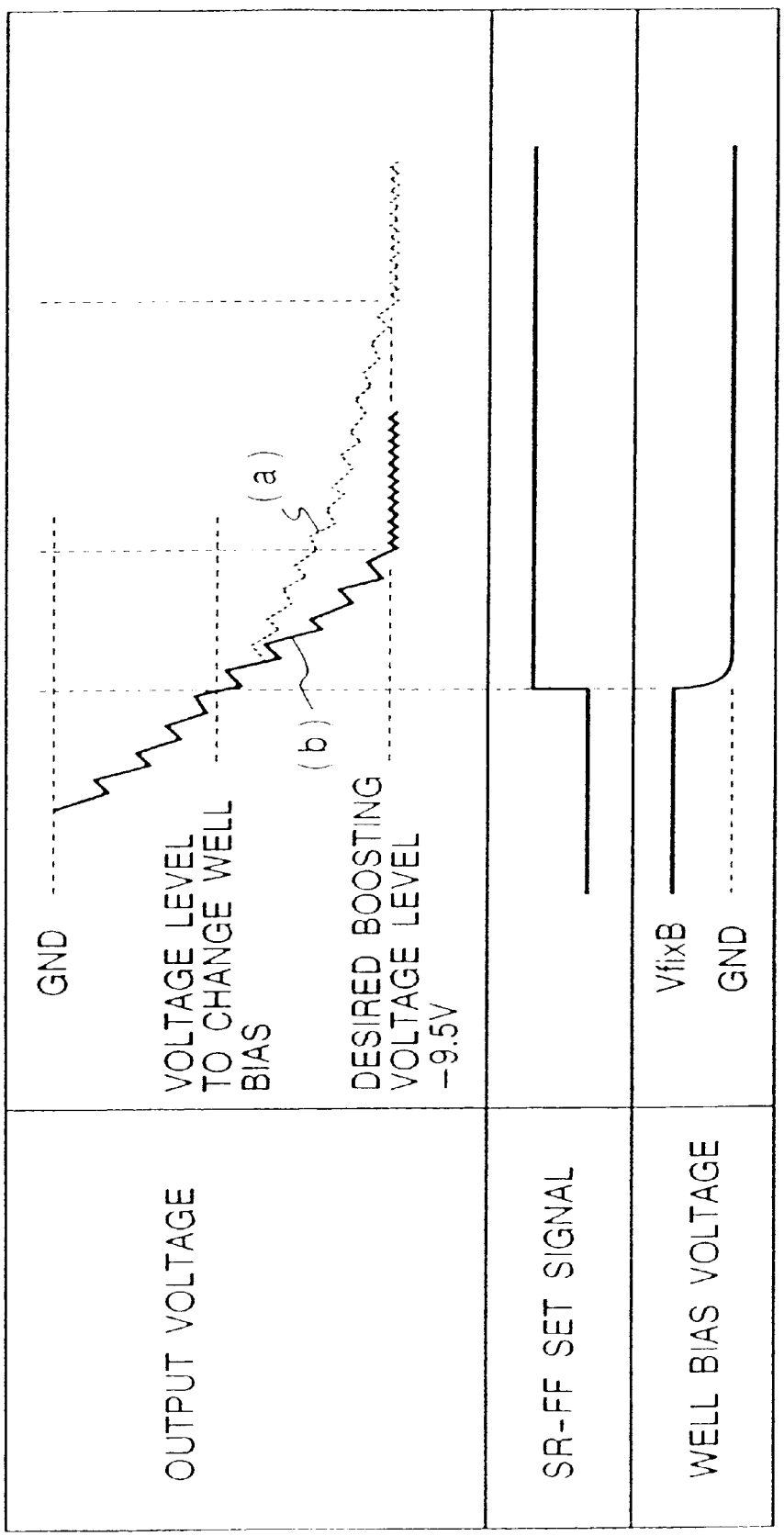
FIG. 22 is a diagram outlining transitions of a boosted voltage during a negative voltage boosting operation.

FIG. 22 illustratively outlines transitions of the boosted voltage VPPMNS9 during a negative voltage boosting operation. In FIG. 22, (a) indicates the transition of the boosted voltage VPPMNS9 in effect when the substrate bias voltage is fixed to the clamped voltage VfixB and remains unswitched, and (b) denotes the transition in effect when the substrate bias voltage is switched halfway during the boosting. Compared with the transition (a), the transition (b) is characterized by an improvement in the efficiency in negatively boosting voltages. The transition (b) is also noticeable for a shortened time required to reach the target negative voltage.

Once the substrate bias voltage is switched to the ground potential Vss, the flip-flop 461 remains set even if the output of the comparator 463 is inverted thereafter. That is, the flip-flop 461 has a hysteresis characteristic which maintains the substrate bias voltage at the ground potential Vss when the boosted voltage VPPMNS9 fluctuates in amplitude following the switching of the substrate bias voltage. Such a hysteresis characteristic may be implemented alternatively by use of a hysteresis comparator as the comparator 463 in place of the SR flip-flop 461.

As shown in FIG. 22, a voltage being boosted by a charge pump circuit fluctuates in amplitude in synchronism with switching actions of the MOS transistors Q10, Q11 and Q12 for charge pump purposes. When the substrate bias voltage of the charge pump circuit 47 is switched using an output signal of a circuit, such as the flip-flop 461, having a suitable hysteresis characteristic, it is possible to forestall undesirable substrate bias voltage fluctuations such as those that may let the switched substrate bias voltage be reverted to the initial substrate bias voltage level under the influence of ripples in the negatively boosted voltage.

Software-Based Trimming of the Power Supply Circuit

The feedback resistance circuit FBR1 of the constant voltage generation circuit 401 shown in FIGS. 12 and 16 and the resistance circuit 436 in FIG. 14 are each a resistance circuit capable of trimming (i.e., trimming resistance circuit). The resistance circuit, as described with reference to FIG. 16, has a structure similar to that of what is known as a ladder resistance circuit wherein one of numerous switches 410 is turned on to determine a potential-dividing point taken as an output node. The feedback resistance circuit FBR1 has its feedback resistance value determined in line with the resistance potential dividing ratio of the output node selected by a switch 410. Likewise, the comparator 463 is supplied with a voltage corresponding to the resistance potential dividing ratio of that node (ND1) in the resistance circuit 436 which is selected by a switch 410. The fact that the feedback resistance circuit FBR1 is capable of trimming is significant in that it allows the clamped voltages VfixA and VfixB to be set to desired levels with respect to the suitably adjusted reference voltage Vref of the power supply circuit 40 for absorbing process-dependent variations. Getting the resistance circuit 436 to be capable of trimming on the negative voltage boosting circuit side makes it possible to optimize negative voltage boosting operations, with the voltage boosting level and the well bias voltage switching point made adjustable with regard to the negatively boosted voltage VPPMNS9 having the widest span of voltage boosting. Alternatively, the resistance circuits 428 and 429 on the positive voltage boosting circuit side may be arranged to be capable of trimming.

Figure 23:
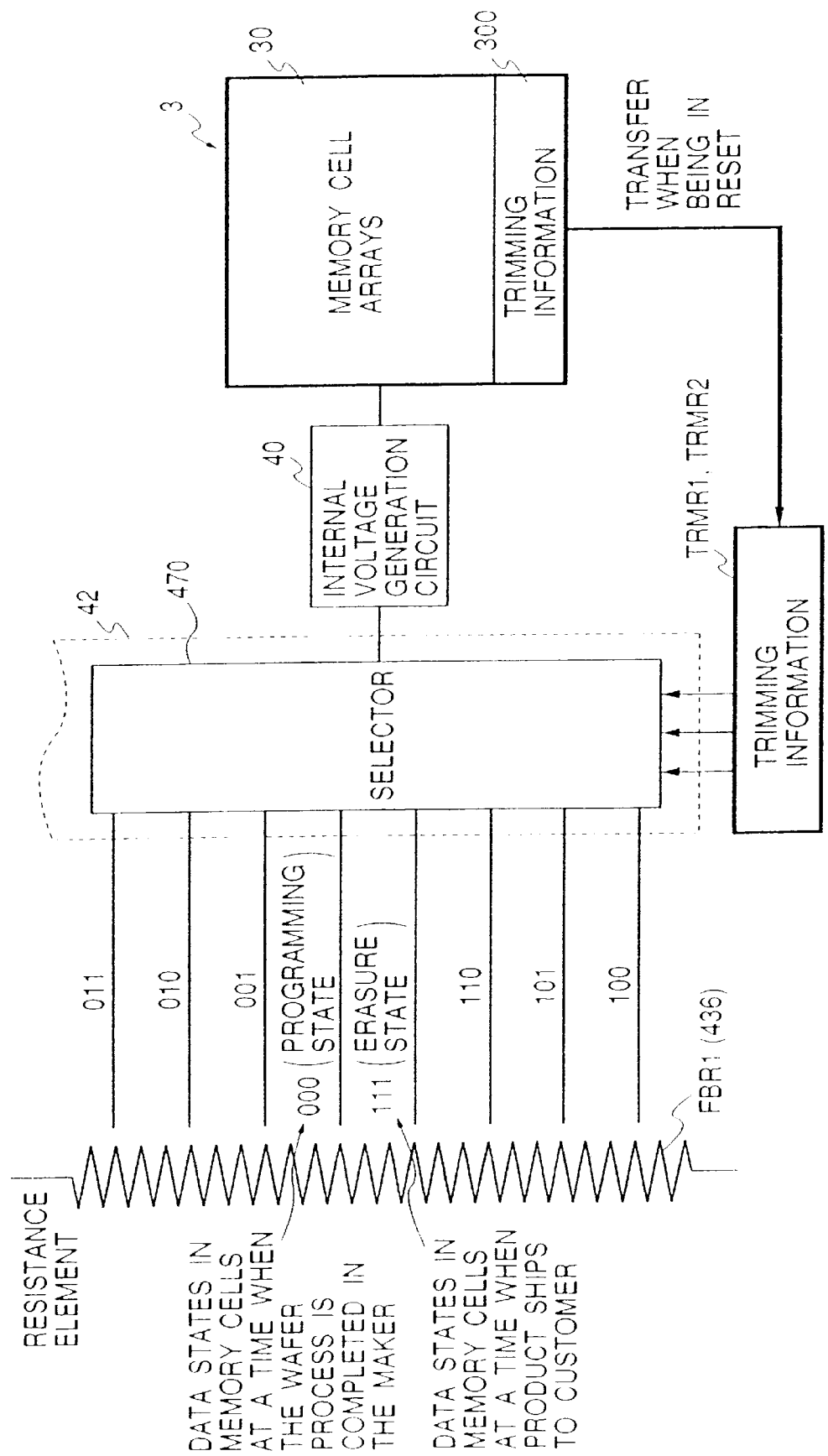
FIG. 23 is a conceptual diagram depicting the concept of trimming by the trimming capacitor circuit.

As shown in FIG. 23, a selector 470 generates a selection signal for selecting a switch 410 that determines the resistance potential dividing ratio at an output node of each of the resistance circuits (also called trimming resistance circuits) FBR1 and 436. In the example of FIG. 23, the selector 470 decodes trimming information and brings one switch selection signal to the selection level accordingly. The trimming resistance circuits FBR1 and 436 have their own selectors 470 that are included in the trimming control circuit 42 shown in FIG. 4.

The trimming information for the resistance circuit FBR1 is fed to the selector 470 of the circuit FBR1 from the reference voltage trimming register TRMR1; while the trimming information for the resistance circuit 436 is supplied to the selector 470 of the circuit 436 from the boosted voltage trimming register TRMR2. As illustrated in FIG. 25, the trimming information set in the reference voltage trimming register TRMR1 (i.e., reference voltage trimming information) includes VR0 through VR4 and TEVR, and the trimming in formation set in the boosted voltage trimming register TRMR2 (boosted voltage trimming information) comprises VM0 through VM4 and TEVM.

Figure 24:
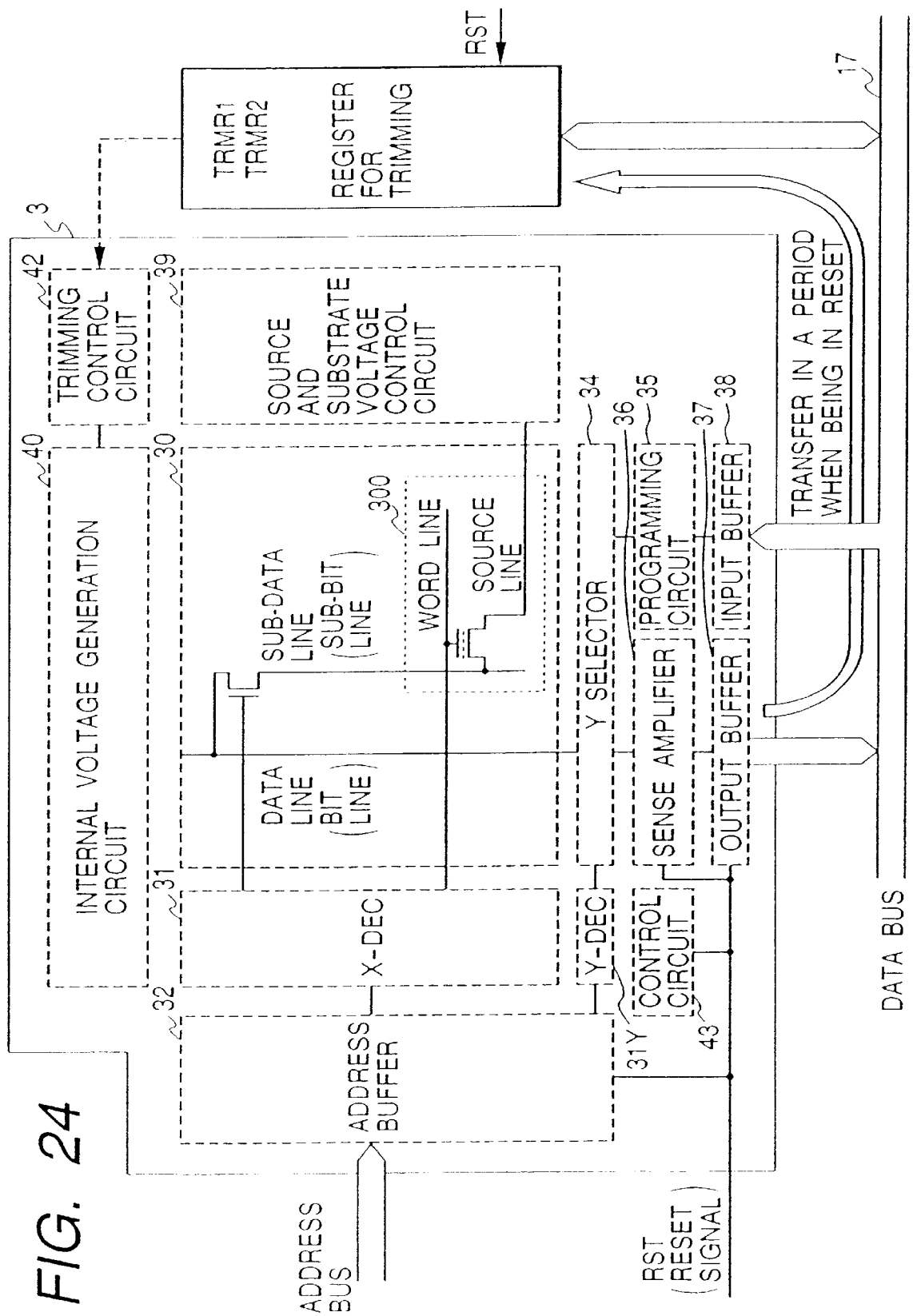
FIG. 24 is a schematic diagram illustrating a method for transferring trimming adjustment information from a flash memory to a control register in synchronism with reset operations of the microcomputer.

The memory cell arrays 30 of the flash memory 3 are assigned a storage region dedicated to accommodating the reference voltage trimming information and boosted voltage trimming information, as depicted in FIG. 23. In this example, the information in the region 300 is transferred to the registers TRMR1 and TRMR2 in synchronism with reset operations of the microcomputer 1. The transfer of the information is automatically controlled, but the inventions not so limited, by hardware as shown in FIG. 24. Specifically, when a reset signal RST is asserted, the control circuit 43 of the flash memory 3 causes the address buffer 32, sense amplifier 36 and output buffer 37 automatically to read data from the region 300 and place the data onto the data bus 17. Meanwhile, at the time when the reset signal RST is asserted, the registers TRMR1 and TRMR2 are made ready to receive the data from the data bus 17. In this manner, the data in the region 300 is transferred automatically to the registers TRMR1 and TRMR2.

The reference voltage trimming information and boosted voltage trimming information are determined at the time of device tests so as to absorb process-dependent variations. The data transfer described with reference to FIG. 24 also takes place when the test mode is set on the microcomputer 1. In the early stage of device tests with the wafer completed, the flash memory 3 is in the programming state (i.e., trimming information in the region 300 has all bits set to logical "0"). Thus the trimming information for the registers TRMR1 and TRMR2 also has all bits set to logical "0." In the test mode, the CPU 2 renders the registers TRMR1 and TRMR2 ready to have data written and read thereto and therefrom. At the time of device tests, the monitor terminals VppMON and VssMON are used to monitor positively and negatively boosted voltages so as to determine optimal reference voltage trimming information and boosted voltage trimming information which will allow the necessary voltage levels to be attained. Thus determined, the reference voltage trimming information and boosted voltage trimming information are placed into the region 300 of the flash memory 3 under control of the CPU 2 in the appropriate test mode. Thereafter, every time the microcomputer 1 is reset, the power supply circuit 43 is controlled in accordance with the optimally determined reference voltage trimming information and boosted voltage trimming information. In the normal operation mode (or user mode), the register 300 is kept inaccessible. If the appropriate test mode is again established, the region 300 will be accessed to have the reference voltage trimming information and boosted voltage trimming information set thereto again. The device tests by a semiconductor manufacturer include tests upon shipment in addition to those in the wafer stage. It is also possible to set reference voltage trimming information and boosted voltage trimming information in each different test stage. It is expected that the reference voltage trimming information and boosted voltage trimming information are finally written to the region 300 following the tests in the shipment stage.

In this example, the flash memory 3 is in the programming state (e.g., logical "0" of a low threshold voltage) when the wafer is completed. Upon shipment of the microcomputer 1, the flash memory 3 is in the erasure state (e.g., logical "1" of a high threshold stage). Preferably, there should not be any appreciable difference in the output voltage of the power supply circuit between the programming state and the erasure state, the difference being attributed to extremely trimmed voltages in programming and erasure. For example, where the reference voltage trimming information and boosted voltage trimming information are eventually written to the region 300 following the shipment-stage tests, the efficiency of the testing or inspection will suffer if there is a significant difference between an initially boosted voltage in tests at the wafer stage on the one hand and an initially boosted voltage in tests upon shipment on the other hand. Microcomputer chips that do not need trimming may be shipped in the erased state.

In order to meet the requirement stated above, the selector 470 has logic such that the trimming position in effect when the trimming adjustment information has all bits set to logical "1" and the trimming position in effect when the trimming adjustment information has all bits set to logical "0" will be selected to be adjacent to each other. This arrangement minimizes the difference in the output voltage of the power supply circuit between where the flash memory is programmed upon completion of the wafer and where the flash memory is erased upon shipment. In the example of FIG. 23, with the flash memory programmed (i.e., trimming information in the region 300 has all bits set to logical "0") upon completion of the wafer, the switch for the trimming position "000" is selected in the selector. With the flash memory erased (i.e., trimming information in the region 300 has all bits set to logical "1") upon shipment of the microcomputer, the switch for the trimming position "111" is selected in the selector.

As evident from FIG. 12, the trimming adjustment information also affects the read voltage for the flash memory 3. Specifically, the clamped voltage Vrefa output by the constant voltage generation circuit 401 containing the feedback resistance circuit FBR1 to be trimmed serves as the reference voltage for the clamped voltage generation circuit 403 generating voltages for the read operation. In this setup, the transfer of the trimming adjustment information from the flash memory 3 to the register TRMR1 should preferably take place during a read access operation that will take longer than a predetermined access time for the read operation on the flash memory 3. Such an arrangement is preferred with a view toward preventing a malfunction. The reason is that the prolonged read time ensures a reliable data read from the memory arrays even if the read voltage is slightly lower at the time than is required. With that aspect taken into account, initial transfer of the trimming adjustment information is carried out in synchronism with a reset operation. This makes it possible for the internal voltage fluctuations to settle during the reset before the trimming action is settled. After the reset operation, a stabilized read operation is carried out. Where the trimming adjustment information affects only the write and erase voltages, the trimming adjustment information may be transferred either during the reset or before a first vector fetch (i.e, instruction fetch) following the release of the reset state.

Programming Sequence for the Flash Memory

FIG. 25 shows detailed formats of the programming control register FLMCR1 and of the erasure block designation register EBR1 for the flash memory 3. In the erasure block designation register EBR1, bits EB0 through EB7 constitute erasure block designation data. The programming control register FLMCR1 comprises control bits P, E, PV, EV, PSU, ESU, SWE and FWE whose true values are set typically to logical "1."

The programming enable bit SWE is used to instruct the power supply circuit 40 to prepare for a boosting operation. Illustratively, setting the programming enable bit SWE to logical "1" asserts the control signal OSE shown in FIG. 13. This causes the ring oscillator 48 to start oscillating and to output a clock signal CLK. The clamped voltage VfixB for boosting is also turned on.

The programming set-up bit PSU instructs the power supply circuit 40 to start boosting a voltage for programming. In this example, setting the programming set-up bit PSU to logical "1" asserts the control signals VPE1, VPE2 and VPE3. This initiates the operation of the clock drivers 420, 421 and 434 as well as that of the charge pump circuits 45, 46 and 47, whereby the voltages VPP6, VPP9 and VPPMNS9 start to be boosted to +6.5 V, +9.5 V and −9.5 V respectively. To actually carry out the boosting operations requires that the ring oscillator 48 furnish the clock signals CLK.

The programming enable bit P designates the start of a programming operation by use of the boosted voltages VPP6, VPP9 and VPPMNS9.

The erasing set up bit ESU instructs the power supply circuit 40 to start a boosting operation for erasure. In this example, setting the erasing set-up bit ESU to logical "1" asserts the control signal VPE2 shown in FIG. 13 and the control signal VPE3 in FIG. 14. This causes the clock drivers 420 and 434 as well as the charge pump circuits 45 and 47 to start their operations, thereby starting to boost the voltages VPP9 and VPPMNS9 to +9.5 V and −9.5 V,respectively. To actually effect the boosting operations requires that the ring oscillator 48 supply the clock signals CLK.

The erasing enable bit E is used to designate the start of an erasing operation by use of the boosted voltages VPP9 and VPPMNS9.

It takes an appreciable amount of time for the boosting means to boost voltages to necessary levels. The elapsed times vary due to process-dependent variations. Programming and erasing operations must be started after the boosted voltages have reached their required levels. In such cases, the time it takes from the start of a boosting operation until the start of a programming operation may be determined as the time that elapses from the time the bit PSU is set to logical "1" until the bit P is set to logical "1." Likewise, the time required from the start of a boosting operation until the start of an erasing operation may be determined as the time that elapses from the time the bit ESU is set to logical "1" until the bit E is set to logical "1." These bits are set as needed by the CPU 2 executing suitable software. The arrangement eliminates the need for installing hardware, such as a timer to control when to actually start an erasing or programming operation after the operation has been designated. The timings may be determined as desired in keeping with circuit characteristics.

The erasing set-up bit ESU and programming set-up bit PSU allow a boosting operation to be actually started on condition that the programming enable bit SWE is set to its true value. In other words, the programming or erasing operation is made executable only by setting the programming enable bit SWE to the true value. This arrangement helps prevent the flash memory 3 from being inadvertently programmed by a runaway CPU 2.

The protect bit FWE in the programming control register FLMCR1 is set to a value reflecting the status of the external terminal Pfwe. The bit FWE is dedicated to read operations. Only on condition that the protect bit FWE be set to its true value (e g, logical "1" ), is the boosting enable bit SWE allowed to be set to logical "1" in an interlocking fashion. That is, the protect bit FWE is used as one of the signals for initializing the boosting enable bit SWE. Only when FWE= 1, is the boosting enable bit SWE allowed to be set or cleared When FWE=0, the boosting enable bit SWE is initialized. Illustratively, there may be provided an AND gate, not shown, for AND'ing the protect bit FWE and the corresponding signal line from the data bus so that the output of the AND gate will be set to the boosting enable bit SWE. This will also constitute an interlocking protective arrangement. The reinforced interlocking feature implemented by the bit SWE plus the protect bit FWE doubles protection against inadvertent programming. This further enhances the reliability in protecting the flash memory 3 against being accidentally reprogrammed.

Figure 26:
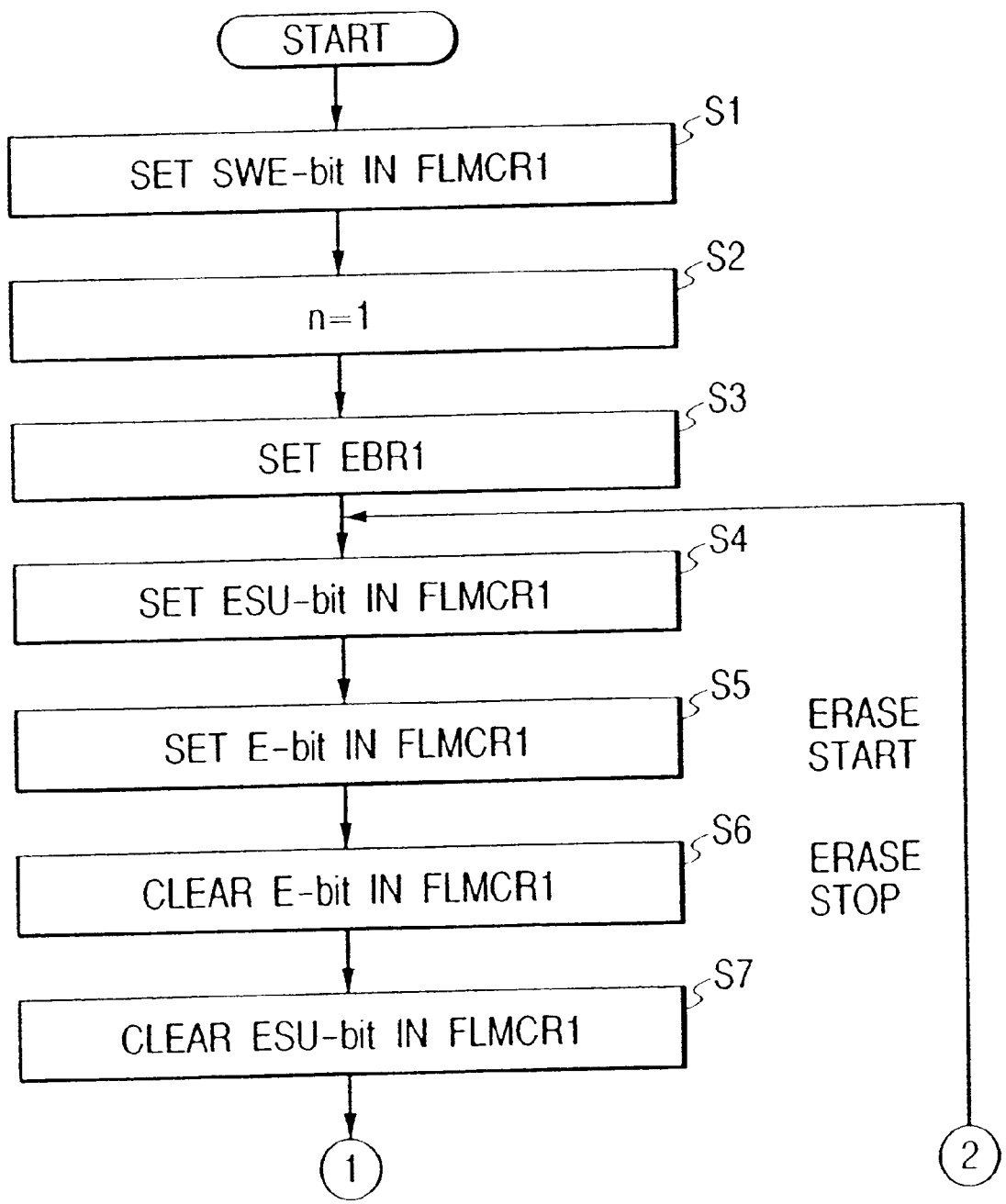
FIG. 26 is a flowchart showing the first half of steps for control over an erasure operation by a CPU.
Figure 27:
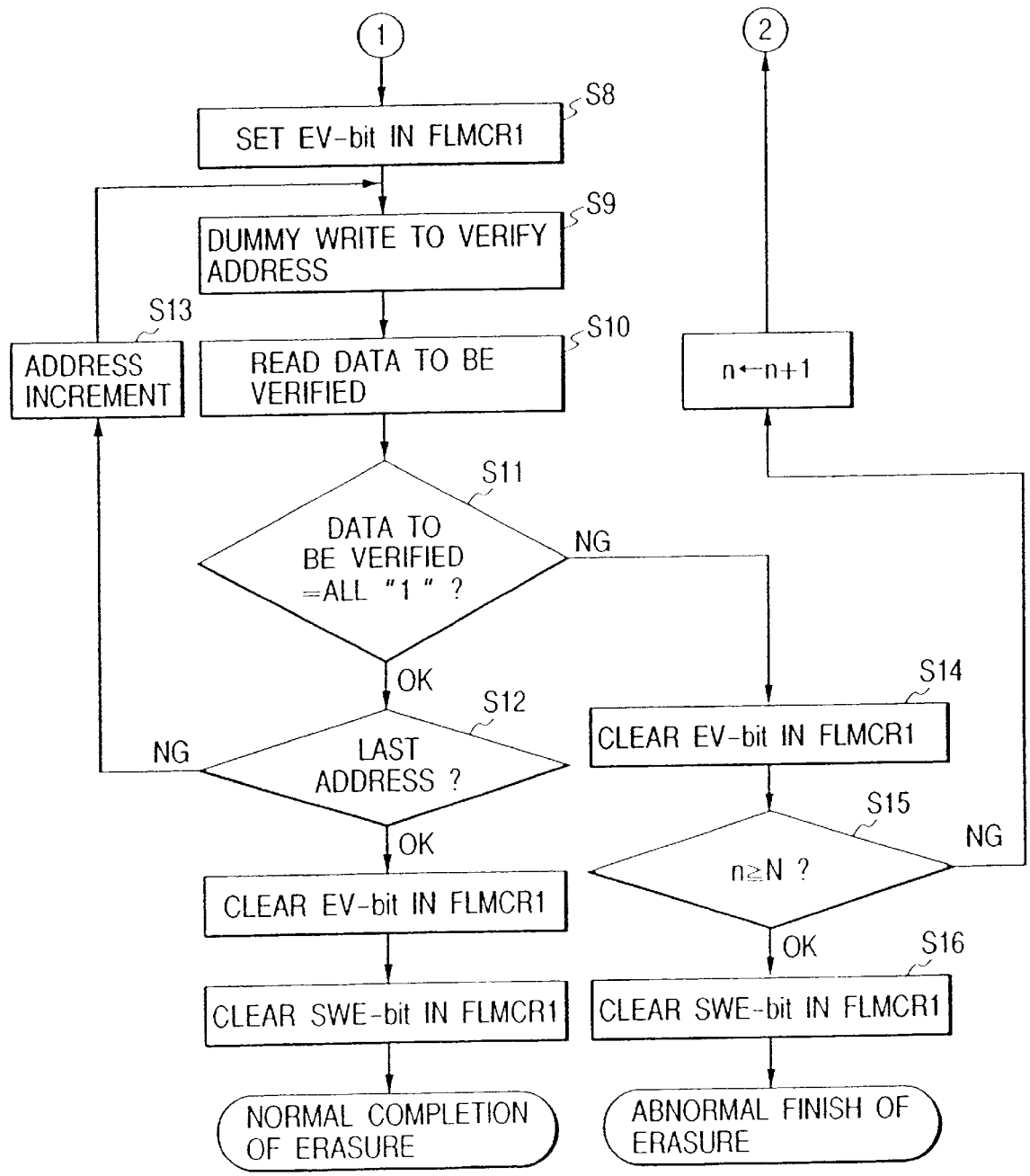
FIG. 27 is a flowchart showing the second half of steps for control over the erasure operation by the CPU.

FIGS. 26 and 27 are flowcharts of steps for control over an erasure operation by the CPU 2. In step S1, the CPU 2 sets the SWE bit of the register FLMCR1 to logical "1." To enable the setting of the SWE bit presupposes that the protect bit FWE is set to logical "1" by application of a logical "1" signal to the external terminal Pfwe. This causes the ring oscillator to start oscillating. In step S2, a value n=1 is inserted into an appropriate register. In step S3, an erasure block is set in the register EBR1. In step S4, the ESU bit of the register FLMCR1 is set to logical "1." This causes tire clock drivers 420 and 434 as well as the charge pump circuits 45 and 47 to start a charging operation. Upon elapse of a predetermined period of time, the E bit of the register FLMCR1 is set to logical "1" in step S5. This starts an erasure operation. When the erasure is complete, the E bit of the register FLMCR1 is cleared to logical "0" to terminate the erasure operation in step S6. In step S7, the ESU bit of the register FLMCR1 is cleared to logical "0" to stop the boosting operation. Thereafter, the EV bit of the register FLMCR1 is set to logical "1" in step S8 This triggers an erase-verify operation following the erasure. After the erase-verify operation, dummy data is written to a verify address in step S9, and the data to be verfified is read in step S10. In step S11, a check is made to see if the read data to be verified has all bits set to logical "1." If all bits are found to be logical "1," then the address is incremented until the last address is reached in steps S12 and S13. The steps subsequent to step S9 are repeated every time the address is incremented. If the data read in step S11 is not found to have all bits set to logical "1", that means that the erasure was insufficient. In that case, the EV bit is cleared in step S14. In step S15, a check is made to see if the erase repeat count has reached its upper limit (N). If the erase repeat count has yet to attain the upper limit ("NG" in step S15), step S4 is again reached in which another erasure is carried out. If the last address is reached in step S12, the erase-verify operation is deemed normally terminated. If the erase repeat count is found to have reached its upper limit, the erase-verify operation is considered abnormally terminated.

Figure 28:
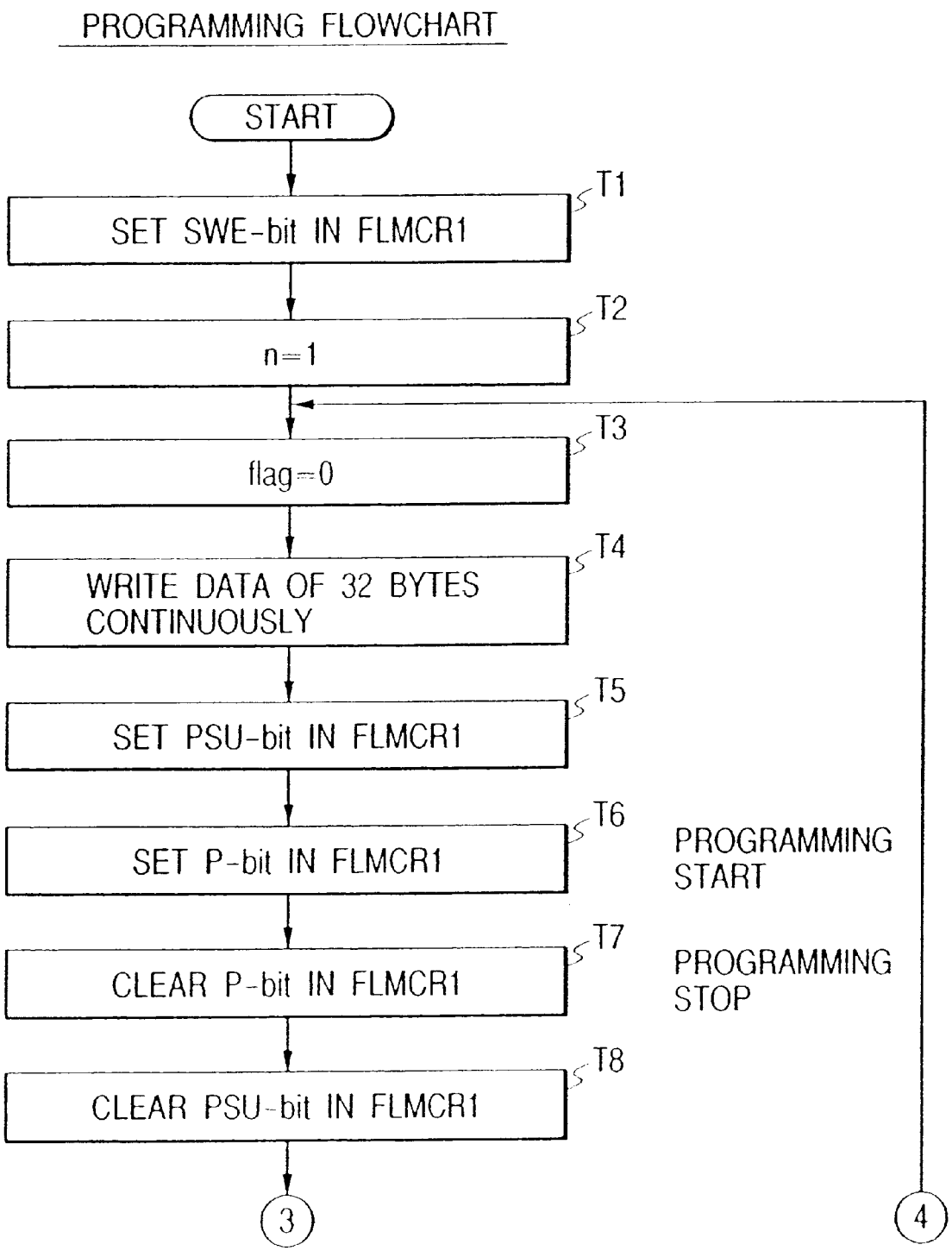
FIG. 28 is a flowchart showing the first half of steps for control over a programming operation by the CPU.
Figure 29:
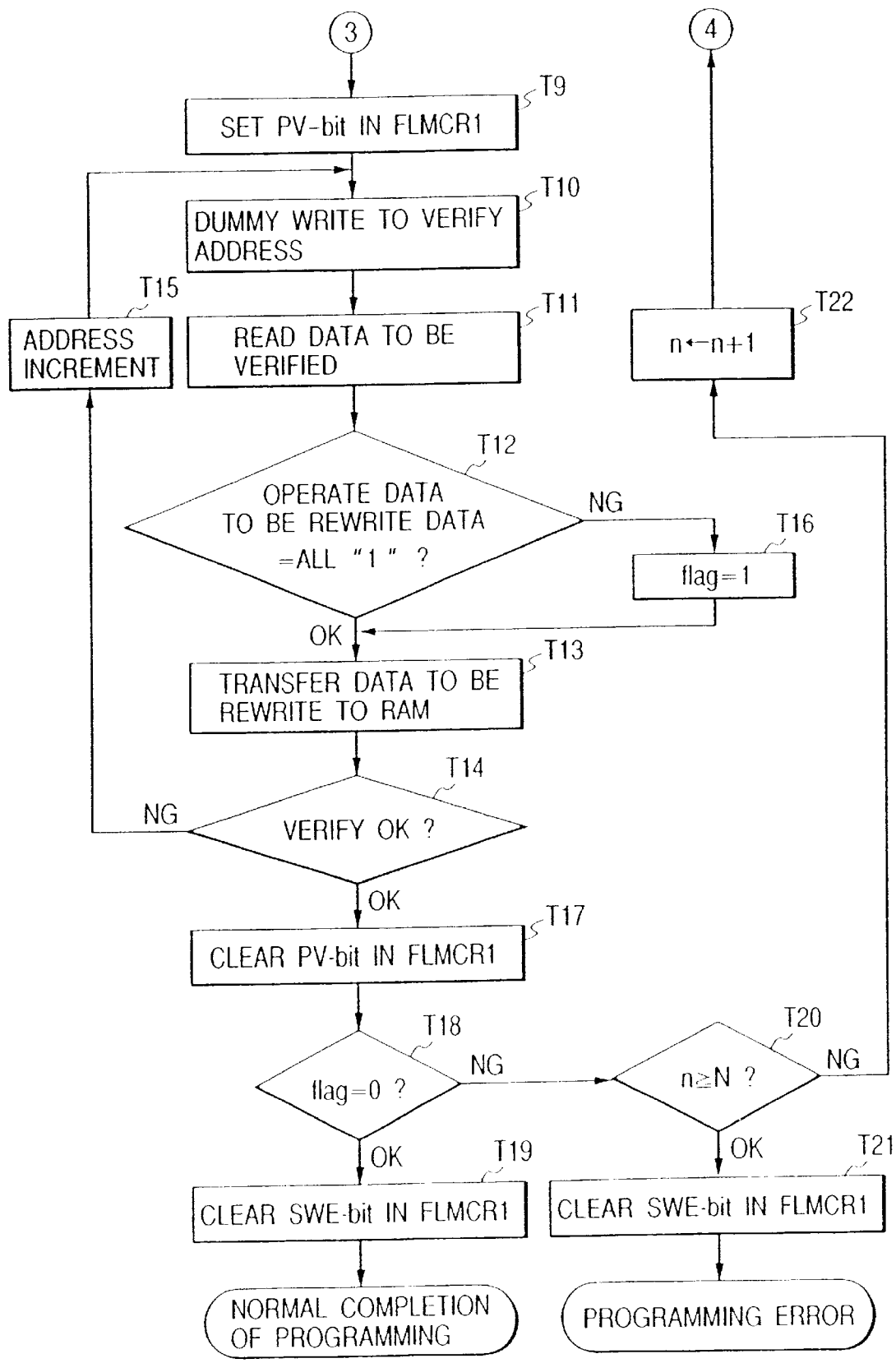
FIG. 29 is a flowchart showing the second half of steps for control over the programming operation by the CPU.

FIGS. 28 and 29 are flowcharts of steps for control over a programming operation by the CPU 2. In step T1, the CPU 2 sets the SWE bit of the register FLMCR1 to logical "1." To enable the setting of the SWE bit presupposes that the protect bit FWE is set to logical "1" by application of a logical "1" signal to the external terminal Pfwe. This causes the ring oscillator to start oscillating. In step T2, a value n=1 is inserted into an appropriate register. In step T3, an appropriate flag is cleared to zero. In step T4, programming data of, say, 32 bytes is written consecutively to the flash memory 3. The written data is retained in a data register contained in the programming circuit of the flash memory 3. In step T5, the PSU bit of the register FLMCR1 is set to logical "1." This causes the clock drivers 420, 421 and 434 as well as the charge pump circuits 45, 46 and 47 to start a boosting operation. Upon elapse of a predetermined period of time, the P bit of the register FLMCR1 is set to logical "1" to start a programming operation in step T6. In step T7, with the programming completed, the P bit of the register FLMCR1 is cleared to logical "0" to stop the programming operation. In step T8, the PSU bit of the register FLMCR1 is cleared to logical "0" to terminate the boosting operation.

Thereafter, the PV bit of the register FLMCR1 is set to logical "1" in step T9. This initiates a write-verify operation following the programming operation above. In the write-verify operation, dummy data is written to a verify address in step T10 and the data to be verified is read in step T11. In step T12, rewrite data is computed on the basis of the read data to be verified and of the initially written data, and a check is made to see if the rewrite data thus computed has all bits set to logical "1." The computation of the rewrite data is carried out as shown in FIG. 30. If the rewrite data is found to have all bits set to "1," then the rewrite data is transferred to the RAM in step T13. In steps T14 and T15, the address is incremnented until the data of 32 bytes has been verified. That is, the steps subsequent to step T10 are repeated until all data has been verified. If the rewrite data is not found to have all bits set to "1" in step T12, then the flag is set to "1" in step T16, and step T14 is reached again. When the data of 32 bytes has all been verified, the PV bit is cleared in step T17. In step T18, a check is made to see if the flag is set to "0." If the flag is found to be "0," that means that the programming of 32 bytes is normal. In that case, the SWE bit is cleared in step T19 to terminate the programming operation. If the flag is found to be "1" in step T18, step T20 is reached. In step T20, a check is made to see if the write repeat count has reached a predetermined upper limit (N). If the upper limit is found to be reached, the SWE bit is cleared in step T21 followed by an abnormal termination. If the write repeat count has yet to attain its upper limit (N), the count n is incremented in T22 before step T3 is reached again.

Figure 31:
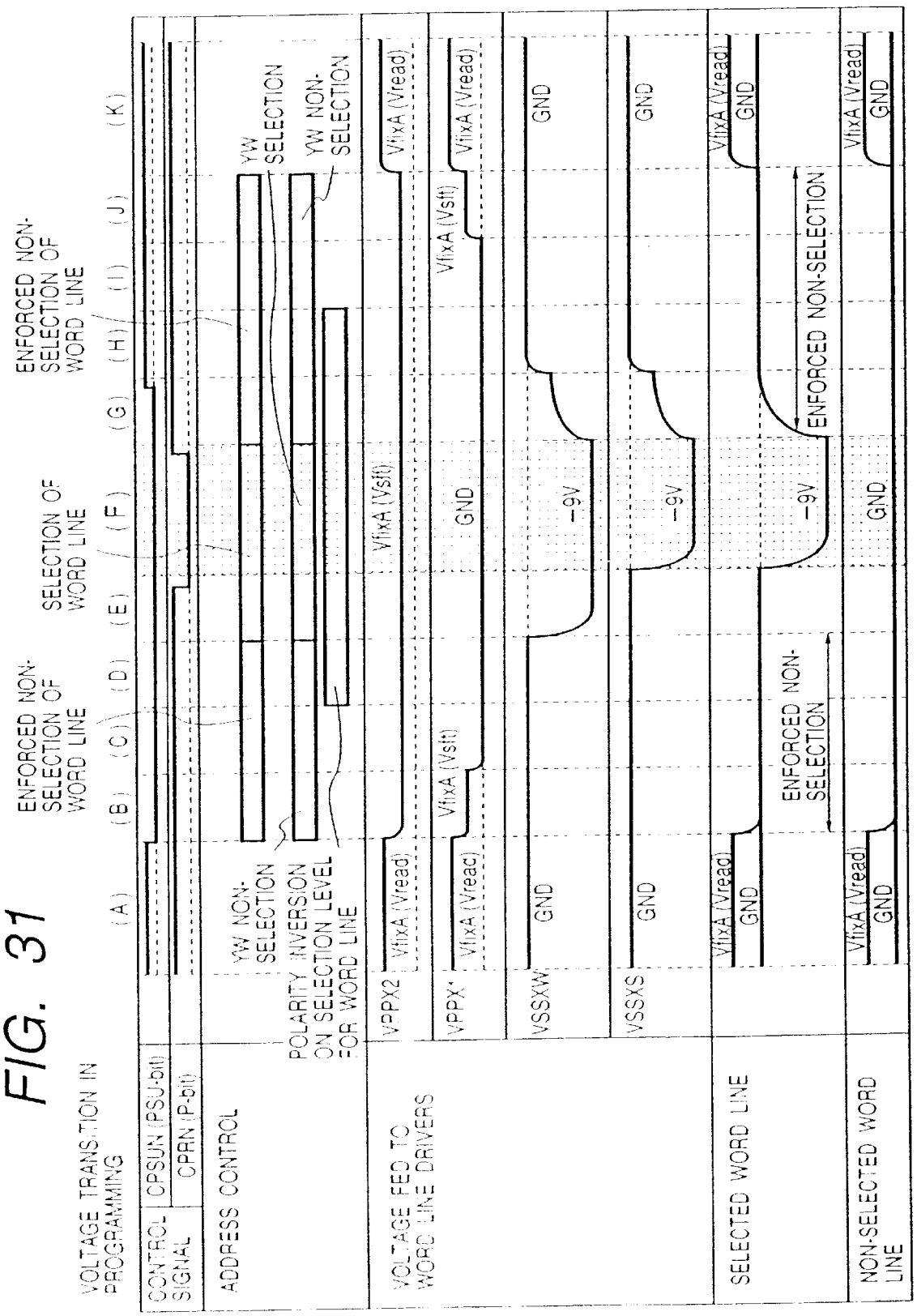
FIG. 31 is a timing chart representing a typical method for switching word line driving voltages so as to alleviate loads imposed on the internal circuits by application of high voltages necessary for programming.

FIG. 31 is a timing chart representing a typical method for switching word line driving voltages so as to alleviate loads imposed on the internal circuits by application of high voltages necessary for programming. Simply put, the word lines are set to the ground potential Vss before operation voltages are switched. More specifically, when the PSU bit designates a boosting operation of the boosting circuit for programming, all word lines are forcibly set to the ground potential Vss in a period (B) of FIG. 31. In a period (C) of FIG. 31, power supplies VPPX2, VSSXW and VSSXS of the word driver WDRV are each switched to the ground potential Vss. Then the polarity for word line selection is inverted as shown in the "Address Control" section in FIG. 31. For example, the selection level of the X address decoder for generating a word line selection signal based on an address signal is logically inverted from the High level (for read operation) to the Low level (for write operation). Thereafter, as shown in a period (E) of FIG. 31, the word driver power supplies are switched to programming voltages. When the programming operation is terminated, all word lines are forcibly switched likewise to the ground potential Vss; the driver power supplies VPPX1, VSSXW and VSSXS are switched to the ground potential; and the polarity of the word line selection logic is changed, so as to switch the power supplies. The power supply switchover is effected by a group of power supply switches included in the power supply circuit 40 under control of a programming sequencer in the power supply control circuit 41.

Although the description above contains many specificities, these should not be construed as limiting the scope of the invention but as merely providing illustrations of the presently preferred embodiments of this invention. It is to be understood that changes and variations may be made without departing from the spirit or scope of the claims that follow.

For example, the single external power supply is not limited to the voltage range of 2.7 V to 5.5 V. Voltages may be boosted to levels other than 6.5 V, 9.5 V and −95 V. Similarly, the clamped voltage is not limited to 2.5 V, and the ways in which the voltages for programming and erasure are applied are not limited to what has been described above. The boosting and clamp circuits may be modified in structure as needed. Where the current supply capacity is sufficiently high, the clamped voltages furnished separately for the read and boosting systems may be unified for shared use. The modules incorporated in the microcomputer may be altered as desired. The flash memory may adopt any of suitable circuit schemes such as NOR and AND logic. The flash memory is not limited to replacing the program memory; it may instead be used exclusively for accommodating data.

This invention has been described with particular emphasis on its background art and derived applications, i.e., setups in which the inventive semiconductor integrated circuit device is applied to specialized microcomputers for controlling the apparatus in which it is incorporated. However, this is not limitative of the invention. The semiconductor integrated circuit device of this invention may also be applied to general-purpose microcomputers, dedicated controller LSIs and other diverse apparatuses that will benefit from utilizing semiconductor integrated circuits.

The major advantages of this invention are summarized as follows:

The voltage clamp means generates a voltage that is negligibly dependent on a supply voltage. The voltage thus generated is clamped to a voltage level which, within a tolerable range of supply voltages, is lower than the single supply voltage externally furnished. The clamping prevents the voltages boosted by the boosting means operating on the clamped voltage, i.e., programming and erasure voltages, from being dependent on the externally supplied voltage. This in turn makes it possible to erase and program the incorporated non-volatile memory in a relatively wide range of externally supplied voltages including those for low voltage operations. Because these features are provided by use of a single external supply voltage, the semiconductor integrated circuit device incorporating the non-voltage memory is made easier and more convenient to use than before.

The efficiency of voltage boosting may be enhanced by changing the substrate bias voltage common to the MOS transistors carrying out charge pump operations when the boosted voltage has reached a predetermined level.

The voltage being boosted by a charge pump operation fluctuates in amplitude in synchronism with switching actions of the MOS transistors for charge pump operations. The resulting ripple effect may cause the substrate bias voltage to oscillate. Such oscillation is forestalled by the switching means possessing a hysteresis characteristic for maintaining the substrate bias voltage to a switched voltage when the boosted voltage fluctuates in amplitude after the switching of the voltages.

Where a plurality of charge pump circuits operate from a single power supply, instantaneous drops in the power supply voltage are minimized by staggering the charge pump circuits in their operative phases.

Appropriate register means is provided to receive the trimming adjustment information that is transferred from a specific region of the non-volatile memory. The information allows the output voltage of the voltage clamp means to be trimmed as desired by software. This makes it possible to absorb process-dependent variations specific to individual chips.

The transfer of the trimming adjustment information to the register means is performed in synchronism with reset operations of the semiconductor integrated circuit device. This permits internal voltage fluctuations to settle during a reset operation before the trimming action is settled.

The CPU is allowed to access the register means in the test mode. This makes it easier to determine the trimming information when the test mode is in effect.

Where the semiconductor integrated circuit device is programmed upon completion of a wafer (e.g., logical "0" of a low threshold voltage) and is erased upon shipment (e.g., logical "1" of a high threshold voltage), it is desirable to minimize variations that may occur in the output voltage of the voltage clamp means as a result of the voltages being trimmed extremely between the programming and the erasure states. The minimizing of such output voltage variations is effected illustratively by adopting the selective logic for determining trimming positions of the trimming circuit in accordance with the trimming adjustment information in such a manner that the trimming position in effect when the trimming adjustment information has an all-bit logic value of "1" becomes adjacent to the trimming position in effect when the trimming adjustment information has an all-bit logic value of "0."

The programming set-up bit and the erasure set-up bit are used by the CPU 2 as the latter executes appropriate software to control when to start an erasing or programming operation after a suitably boosted voltage is obtained by the boosting means for the operation. This arrangement eliminates the need for installing additional hardware such as timers.

The control register may include a programming enable bit for instructing the boosting means to prepare for a boosting operation so that the instruction based on the erasing set-up bit or the programming set-up bit is accepted only if the programming enable bit is set to its true value. That is, a programming or erasure operation is carried out on condition that the programming enable bit is set to the true value. This arrangement prevents the non-volatile memory from being inadvertently reprogrammed, for example, by a runaway CPU.

Inadvertent reprogramming of the non-volatile memory is prevented more reliably by the control register additionally including a protect bit which is set in accordance with the status of an external terminal, so that the setting of the programming enable bit to the true value is enabled in an interlocking manner only if the protect bit is set to its true value.

The word lines are connected to the ground potential before the applied voltages are changed. This arrangement minimizes the loads exerted on the internal circuits by the high voltages required for the erasure or programming operation.

We claim:

1. A semiconductor integrated circuit comprising:

electrically erasable and programmable non-volatile memory elements that store information;

a register capable of storing the information therein; and an internal circuit coupled to the register, wherein the information is transferred from the electrically erasable and programmable non-volatile memory elements to the register in response to an initialization operation of the semiconductor integrated circuit, so that characteristics of the internal circuit can be controlled by the information stored in the register.

2. A semiconductor integrated circuit according to claim 1, wherein the initialization operation includes a reset operation of the semiconductor integrated circuit.

3. A semiconductor integrated circuit comprising:

a memory array including:

first electrically erasable and programmable memory cells, and second electrically erasable and programmable memory cells which store information;

a register capable of storing the information therein; and a peripheral circuit which is coupled to the memory array and which controls a read operation, an erase operation or a programming operation for the memory array, wherein the peripheral circuit is further coupled to the register, wherein the information stored in the second electrically erasable and programmable non-volatile memory elements is read out to the register in response to an initialization operation of the semiconductor integrated circuit, so that characteristics of the peripheral circuit can be controlled based upon the information stored in the register.

4. A semiconductor integrated circuit according to claim 3, wherein the peripheral circuit includes an internal voltage generator for providing internal voltages including an erase voltage or a programming voltage, and wherein voltage levels of the internal voltage from the internal voltage generator are controlled by the information.

5. A semiconductor integrated circuit according to claim 4, wherein the initialization operation includes a reset operation of the semiconductor integrated circuit.

6. A semiconductor integrated circuit, comprising:

electrically erasable and programmable non-volatile memory elements that store information;

a register capable of storing the information therein; and an internal circuit coupled to the register, wherein the information is transferred from the electrically erasable and programmable non-volatile memory elements to the register in response to an initialization operation of the semiconductor integrated circuit, so that characteristics of the internal circuit can be controlled by the information stored in the register, wherein said information comprises trimming data.

7. A semiconductor integrated circuit comprising:

first memory cells;

second memory cells which are electrically erasable and programmable non-volatile memory cells and which store information therein;

a register capable of storing the information therein; and a peripheral circuit which is coupled to the first memory cells and which controls a read operation or a write operation for the first memory cells, wherein the peripheral circuit is further coupled to the register, wherein the information in the second memory cells is read out to the register in response to an initialization operation of the semiconductor integrated circuit, so that characteristics of the peripheral circuit can be controlled based upon the information in the register.

8. A semiconductor integrated circuit according to claim 7, wherein the initialization operation includes a reset operation of the semiconductor integrated circuit.

9. A semiconductor integrated circuit according to claim 3, wherein said information comprises trimming data.

10. A semiconductor integrated circuit according to claim 7, wherein said information comprises trimming data.

* * * * *